(12) United States Patent
Komiyama et al.

(10) Patent No.: US 12,428,544 B2
(45) Date of Patent: Sep. 30, 2025

(54) ELECTROMAGNETIC WAVE SHIELD SHEET MANUFACTURING METHOD AND ELECTROMAGNETIC WAVE SHIELD SHEET

(71) Applicant: HOKUETSU CORPORATION, Nagaoka (JP)

(72) Inventors: Hideaki Komiyama, Nagaoka (JP); Atsushi Tamura, Nagaoka (JP); Toshihiko Soyama, Nagaoka (JP)

(73) Assignee: HOKUETSU CORPORATION, Nagaoka (JP)

( * ) Notice: Subject to any disclaimer, the term of this patent is extended or adjusted under 35 U.S.C. 154(b) by 599 days.

(21) Appl. No.: 17/911,219

(22) PCT Filed: Feb. 1, 2021

(86) PCT No.: PCT/JP2021/003537
§ 371 (c)(1),
(2) Date: Sep. 13, 2022

(87) PCT Pub. No.: WO2021/199649
PCT Pub. Date: Oct. 7, 2021

(65) Prior Publication Data
US 2023/0105161 A1    Apr. 6, 2023

(30) Foreign Application Priority Data

Apr. 1, 2020   (JP) .................. 2020-065640

(51) Int. Cl.
*C08L 1/28*    (2006.01)
*C08J 3/21*    (2006.01)
(Continued)

(52) U.S. Cl.
CPC .............. *C08L 1/286* (2013.01); *C08J 3/212* (2013.01); *C08K 3/041* (2017.05); *C08K 3/346* (2013.01);
(Continued)

(58) Field of Classification Search
None
See application file for complete search history.

(56) References Cited

U.S. PATENT DOCUMENTS

2005/0008845 A1   1/2005   Hatanaka et al.
2010/0189993 A1   7/2010   Mori et al.
(Continued)

FOREIGN PATENT DOCUMENTS

CN     101353547 A     1/2009
CN     102762083 A    10/2012
(Continued)

OTHER PUBLICATIONS

Feb. 25, 2025 Office Action issued in Korean Patent Application No. 10-2022-7029045.
(Continued)

*Primary Examiner* — Joseph D Anthony
(74) *Attorney, Agent, or Firm* — Oliff PLC

(57) ABSTRACT

A method of producing an electromagnetic wave shielding sheet by which an electromagnetic wave shielding sheet having a high shielding property against an electromagnetic wave and having low cost is produced. The method of producing an electromagnetic wave shielding sheet includes; preparing a dispersion containing carbon nanotubes, an inorganic pigment, sodium carboxymethyl cellulose, and water; and drying the dispersion. In the dispersion, a ratio of a mass of the inorganic pigment to a mass of the carbon nanotubes is 1/4 or more and 1 or less.

5 Claims, 25 Drawing Sheets

(51) Int. Cl.
  *C08K 3/04* (2006.01)
  *C08K 3/34* (2006.01)
  *H05K 9/00* (2006.01)
(52) U.S. Cl.
  CPC .......... *H05K 9/009* (2013.01); *C08J 2301/28* (2013.01); *C08K 2201/014* (2013.01)

(56) References Cited

U.S. PATENT DOCUMENTS

| | | | |
|---|---|---|---|
| 2010/0215945 | A1 | 8/2010 | Ota et al. |
| 2013/0264525 | A1 | 10/2013 | Ota et al. |
| 2015/0284141 | A1 * | 10/2015 | Ni .................. B65D 31/005 428/34.3 |
| 2021/0024722 | A1 | 1/2021 | Fujihashi et al. |
| 2024/0339098 | A1 * | 10/2024 | Gong .................. H04R 1/02 |

FOREIGN PATENT DOCUMENTS

| | | | |
|---|---|---|---|
| CN | 104779078 A | * | 7/2015 |
| CN | 104910722 A | * | 9/2015 |
| CN | 106007933 A | * | 10/2016 |
| CN | 107935495 A | * | 4/2018 |
| CN | 108779256 A | | 11/2018 |
| CN | 108084823 B | | 5/2019 |
| EP | 2 204 493 A1 | | 7/2010 |
| JP | 2007-031710 A | | 2/2007 |
| JP | 2013-056471 A | | 3/2013 |
| JP | 2013-082610 A | | 5/2013 |
| JP | 2015120837 A | | 7/2015 |
| JP | 2016-504709 A | | 2/2016 |
| JP | 6307747 B2 | | 4/2018 |
| WO | 2009041170 A1 | | 4/2009 |

OTHER PUBLICATIONS

Oct. 1, 2024 Office Action issued in Japanese Patent Application No. 2022-511588.
Oct. 16, 2024 Extended European Search Report issued in European Patent Application No. 21780546.4.
Apr. 27, 2021 International Search Report issued in International Patent Application No. PCT/JP2021/003537.
Aug. 25, 2021 Office Action issued in Taiwanese Patent Application No. 110105726.
Dec. 3, 2024 Office Action issued in Chinese Patent Application No. 202180026782.4.
Jun. 18, 2024 Office Action issued in Japanese Patent Application No. 2022-511588.
Jun. 19, 2024 Office Action issued in Korean Patent Application No. 10-2022-7029045.
Jul. 8, 2024 Office Action issued in Chinese Patent Application No. 202180026782.4.

* cited by examiner

| MATERIAL | MANUFACTURING COMPANY | PRODUCT NAME | SHAPE | SIZE [μm] |
|---|---|---|---|---|
| KAOLIN | IMERYS MINERALS JAPAN K.K. | CONTOUR 1500 | PLATE SHAPE | PARTICLE DIAMETER: 2.0, THICKNESS: 0.033 |
| | | HYDROGLOSS 90 | PLATE SHAPE | PARTICLE DIAMETER: 0.5, THICKNESS: 0.035 |
| LIGHT CALCIUM | SHIRAISHI KOGYO KAISHA, LTD. | BRILLIANT-15 | CUBIC SHAPE | PARTICLE DIAMETER: 0.15 |
| | OKUTAMA KOGYO CO., LTD. | TAMAPEARL TP121 | SPINDLE SHAPE | LONG AXIS: 2.2, SHORT AXIS: 0.5 |
| HEAVY CALCIUM | BIHOKU FUNKA KOGYO CO., LTD. | SOFTON 1500 | — | PARTICLE DIAMETER: 1.0 |
| | | SOFTON 2200 | — | PARTICLE DIAMETER: 1.5 |

FIG. 2

| INORGANIC PIGMENT | RATIO OF INORGANIC PIGMENT TO CNTS | THICKNESS [μm] | S21 [dB] @300MHz | S21 [dB] @7GHz |
|---|---|---|---|---|
| KAOLIN 1 | 0.25 | 3.7 | −15.8 | −14.9 |
| KAOLIN 1 | 0.5 | 3.6 | −12.9 | −13.8 |
| KAOLIN 1 | 1.0 | 3.7 | −11.6 | −11.4 |
| KAOLIN 1 | 2.0 | 3.5 | −7.6 | −7.9 |
| KAOLIN 1 | 3.0 | 3.6 | −5.2 | −6.6 |
| KAOLIN 1 | 4.0 | 3.7 | −3.6 | −4.2 |
| KAOLIN 2 | 0.25 | 3.7 | −15.7 | −14.6 |
| KAOLIN 2 | 0.5 | 3.6 | −12.7 | −14.3 |
| KAOLIN 2 | 1.0 | 3.7 | −11.6 | −11.1 |
| KAOLIN 2 | 2.0 | 3.5 | −7.2 | −8.9 |
| KAOLIN 2 | 3.0 | 3.6 | −5.0 | −6.7 |
| KAOLIN 2 | 4.0 | 3.9 | −3.6 | −4.0 |
| LIGHT CALCIUM 1 | 0.25 | 3.6 | −15.5 | −14.5 |
| LIGHT CALCIUM 1 | 0.5 | 3.5 | −12.6 | −13.4 |
| LIGHT CALCIUM 1 | 1.0 | 3.4 | −10.8 | −10.5 |
| LIGHT CALCIUM 1 | 2.0 | 3.4 | −6.3 | −7.7 |
| LIGHT CALCIUM 1 | 3.0 | 3.7 | −4.4 | −6.3 |
| LIGHT CALCIUM 1 | 4.0 | 3.6 | −3.4 | −3.7 |
| LIGHT CALCIUM 2 | 0.25 | 3.5 | −15.4 | −14.1 |
| LIGHT CALCIUM 2 | 0.5 | 3.3 | −12.2 | −13.2 |
| LIGHT CALCIUM 2 | 1.0 | 3.8 | −11.0 | −10.5 |
| LIGHT CALCIUM 2 | 2.0 | 3.5 | −6.4 | −7.5 |
| LIGHT CALCIUM 2 | 3.0 | 3.4 | −4.3 | −5.6 |
| LIGHT CALCIUM 2 | 4.0 | 3.6 | −2.6 | −3.5 |
| HEAVY CALCIUM 1 | 0.25 | 3.8 | −15.0 | −13.7 |
| HEAVY CALCIUM 1 | 0.5 | 3.6 | −11.9 | −12.7 |
| HEAVY CALCIUM 1 | 1.0 | 3.7 | −10.6 | −10.3 |
| HEAVY CALCIUM 1 | 2.0 | 3.3 | −6.0 | −6.7 |
| HEAVY CALCIUM 1 | 3.0 | 3.5 | −3.4 | −4.6 |
| HEAVY CALCIUM 1 | 4.0 | 3.6 | −2.2 | −3.0 |
| HEAVY CALCIUM 2 | 0.25 | 3.6 | −15.1 | −13.4 |
| HEAVY CALCIUM 2 | 0.5 | 3.5 | −12.3 | −12.1 |
| HEAVY CALCIUM 2 | 1.0 | 3.8 | −10.5 | −10.3 |
| HEAVY CALCIUM 2 | 2.0 | 3.3 | −5.0 | −6.1 |
| HEAVY CALCIUM 2 | 3.0 | 3.4 | −3.7 | −4.6 |
| HEAVY CALCIUM 2 | 4.0 | 3.5 | −2.2 | −2.9 |
| ONLY CNTS | | 3.5 | −16.5 | −16.5 |

FIG. 3

| INORGANIC PIGMENT | RATIO OF INORGANIC PIGMENT TO CNTS | THICKNESS [μm] | S21 [dB] @300MHz | S21 [dB] @7GHz | FILM-FORMING PROPERTY |
|---|---|---|---|---|---|
| KAOLIN 1 | 0.25 | 143 | −43.1 | −42.6 | A |
| | 0.5 | 140 | −40.4 | −39.0 | A |
| | 1.0 | 139 | −35.6 | −34.0 | A |
| | 2.0 | 137 | −26.1 | −26.5 | A |
| | 3.0 | 137 | −21.3 | −22.2 | A |
| | 4.0 | 135 | −18.4 | −17.8 | A |
| KAOLIN 2 | 0.25 | 144 | −42.8 | −42.3 | A |
| | 0.5 | 151 | −39.7 | −39.6 | A |
| | 1.0 | 138 | −35.3 | −33.4 | A |
| | 2.0 | 137 | −26.3 | −28.3 | A |
| | 3.0 | 137 | −22.7 | −23.8 | A |
| | 4.0 | 139 | −18.2 | −17.5 | A |
| LIGHT CALCIUM 1 | 0.25 | 140 | −42.3 | −41.1 | A |
| | 0.5 | 142 | −39.9 | −38.5 | B |
| | 1.0 | 142 | −34.6 | −32.4 | C |
| | 2.0 | 136 | −25.6 | −26.0 | C |
| | 3.0 | 132 | −19.9 | −21.8 | C |
| | 4.0 | 132 | −16.1 | −15.1 | C |
| LIGHT CALCIUM 2 | 0.25 | 150 | −41.9 | −41.4 | B |
| | 0.5 | 151 | −39.2 | −37.4 | B |
| | 1.0 | 136 | −33.4 | −32.3 | C |
| | 2.0 | 138 | −25.3 | −25.9 | C |
| | 3.0 | 137 | −19.5 | −22.0 | C |
| | 4.0 | 136 | −15.6 | −15.4 | C |
| HEAVY CALCIUM 1 | 0.25 | 150 | −41.6 | −40.0 | B |
| | 0.5 | 140 | −39.4 | −38.8 | B |
| | 1.0 | 143 | −34.3 | −32.1 | B |
| | 2.0 | 127 | −24.7 | −24.1 | B |
| | 3.0 | 129 | −18.4 | −20.4 | C |
| | 4.0 | 139 | −13.1 | −13.4 | B |
| HEAVY CALCIUM 2 | 0.25 | 145 | −41.6 | −39.8 | A |
| | 0.5 | 143 | −39.3 | −38.0 | B |
| | 1.0 | 136 | −33.4 | −32.3 | B |
| | 2.0 | 134 | −24.8 | −24.7 | C |
| | 3.0 | 135 | −18.9 | −20.6 | C |
| | 4.0 | 134 | −10.9 | −12.2 | B |
| ONLY CNTS | | 141 | −45.6 | −46.5 | A |

FIG. 4

| DISPERSION NO. | CNT : CMC | AQUEOUS COUNTER COLLISION METHOD | DISPERSIBILITY |
|---|---|---|---|
| 1 | 1:9 | PERFORMED | A |
| 2 | 1:6 | PERFORMED | A |
| 3 | 1:3 | PERFORMED | A |
| 4 | 1:1 | PERFORMED | A |
| 5 | 3:1 | PERFORMED | A |
| 6 | 5:1 | PERFORMED | A |
| 7 | 6:1 | PERFORMED | A |
| 8 | 7:1 | PERFORMED | B |
| 9 | 8:1 | PERFORMED | C |
| 10 | 9:1 | PERFORMED | C |
| 11 | NO CMC | PERFORMED | C |
| 12 | 1:1 | NOT PERFORMED | C |

FIG. 11

| DISPERSION | CNT : CMC | THICKNESS [μm] | S21 [dB] | |
|---|---|---|---|---|
| | | | @300MHz | @7GHz |
| 1 | 1 : 9 | 3.5 | −0.20 | −0.97 |
| 2 | 1 : 6 | 3.9 | −0.51 | −1.6 |
| 3 | 1 : 3 | 3.3 | −5.0 | −5.4 |
| 4 | 1 : 1 | 3.6 | −16.8 | −16.7 |
| 5 | 3 : 1 | 3.6 | −16.1 | −15.9 |
| 6 | 5 : 1 | 3.5 | −16.9 | −16.5 |
| 7 | 6 : 1 | 3.7 | −15.7 | −16.4 |
| 8 | 7 : 1 | 3.4 | −15.2 | −15.4 |
| 9 | 8 : 1 | 3.7 | −14 | −14.3 |
| 10 | 9 : 1 | 2.7 | −12.3 | −12.6 |

FIG. 13

| WET PULVERIZATION AND DISPERSION DEVICE | | THICKNESS [μm] | S21 [dB] | |
|---|---|---|---|---|
| TREATMENT TIME [min] | NUMBER OF PASSES | | @300MHz | @7GHz |
| UNTREATED | | 4.62 | −10.9 | −10.8 |
| 0.5 | 1 | 3.92 | −18.4 | −15.5 |
| 1 | 2 | 3.03 | −17.1 | −15.9 |
| 3 | 6 | 3.03 | −17.2 | −16.3 |
| 5 | 10 | 2.82 | −17.3 | −16.6 |
| 10 | 20 | 3.06 | −17.1 | −16.8 |
| 20 | 40 | 3.04 | −17.2 | −16.5 |

FIG. 16

| INORGANIC PIGMENT | RATIO OF INORGANIC PIGMENT TO CNTS | THICKNESS [μm] | Rtp [dB] @6GHz | Rtp [dB] @15GHz |
|---|---|---|---|---|
| KAOLIN 1 | 0.25 | 3.7 | 35.8 | 37.1 |
| KAOLIN 1 | 0.5 | 3.6 | 30.7 | 44.0 |
| KAOLIN 1 | 1.0 | 3.7 | 29.0 | 41.7 |
| KAOLIN 1 | 2.0 | 3.5 | 30.7 | 44.0 |
| KAOLIN 1 | 3.0 | 3.6 | 20.3 | 37.5 |
| KAOLIN 1 | 4.0 | 3.7 | 12.7 | 22.6 |
| KAOLIN 2 | 0.25 | 3.7 | 37.4 | 40.6 |
| KAOLIN 2 | 0.5 | 3.6 | 33.2 | 47.3 |
| KAOLIN 2 | 1.0 | 3.7 | 32.3 | 45.4 |
| KAOLIN 2 | 2.0 | 3.5 | 33.2 | 47.3 |
| KAOLIN 2 | 3.0 | 3.6 | 18.7 | 33.2 |
| KAOLIN 2 | 4.0 | 3.9 | 12.7 | 22.7 |
| LIGHT CALCIUM 1 | 0.25 | 3.6 | 27.6 | 35.4 |
| LIGHT CALCIUM 1 | 0.5 | 3.5 | 34.0 | 47.3 |
| LIGHT CALCIUM 1 | 1.0 | 3.4 | 28.5 | 42.7 |
| LIGHT CALCIUM 1 | 2.0 | 3.4 | 34.0 | 47.3 |
| LIGHT CALCIUM 1 | 3.0 | 3.7 | 16.9 | 30.1 |
| LIGHT CALCIUM 1 | 4.0 | 3.6 | 10.9 | 19.1 |
| LIGHT CALCIUM 2 | 0.25 | 3.5 | 22.9 | 31.4 |
| LIGHT CALCIUM 2 | 0.5 | 3.3 | 33.2 | 47.4 |
| LIGHT CALCIUM 2 | 1.0 | 3.8 | 29.4 | 45.5 |
| LIGHT CALCIUM 2 | 2.0 | 3.5 | 33.2 | 47.4 |
| LIGHT CALCIUM 2 | 3.0 | 3.4 | 16.1 | 28.7 |
| LIGHT CALCIUM 2 | 4.0 | 3.6 | 9.5 | 17.9 |
| HEAVY CALCIUM 1 | 0.25 | 3.8 | 28.8 | 33.9 |
| HEAVY CALCIUM 1 | 0.5 | 3.6 | 33.7 | 45.4 |
| HEAVY CALCIUM 1 | 1.0 | 3.7 | 23.5 | 35.0 |
| HEAVY CALCIUM 1 | 2.0 | 3.3 | 33.7 | 45.4 |
| HEAVY CALCIUM 1 | 3.0 | 3.5 | 14.4 | 26.5 |
| HEAVY CALCIUM 1 | 4.0 | 3.6 | 8.6 | 18.3 |
| HEAVY CALCIUM 2 | 0.25 | 3.6 | 28.4 | 31.1 |
| HEAVY CALCIUM 2 | 0.5 | 3.5 | 32.0 | 45.1 |
| HEAVY CALCIUM 2 | 1.0 | 3.8 | 30.7 | 44.8 |
| HEAVY CALCIUM 2 | 2.0 | 3.3 | 32.0 | 45.0 |
| HEAVY CALCIUM 2 | 3.0 | 3.4 | 15.7 | 28.4 |
| HEAVY CALCIUM 2 | 4.0 | 3.5 | 9.2 | 18.0 |

FIG. 19

ELECTROMAGNETIC WAVE SHIELD SHEET MANUFACTURING METHOD AND ELECTROMAGNETIC WAVE SHIELD SHEET

TECHNICAL FIELD

The present invention relates to a method of producing an electromagnetic wave shielding sheet and an electromagnetic wave shielding sheet.

BACKGROUND ART

A carbon nanotube has a structure in which uniform flat graphite is wound into a tubular shape. Both ends of the carbon nanotube are each closed with a fullerene hemispherical structure and each inevitably have six 5-membered rings. Because of such unique structure, the carbon nanotube has various characteristics and is expected to be applied in a wide range of fields.

For example, in Patent Literature 1, there is a description that a sheet for shielding an electromagnetic wave is produced from a carbon nanotube aqueous dispersion using, as dispersants, a polysaccharide formed of carboxymethyl cellulose or the like and an anionic surfactant.

CITATION LIST

Patent Literature

[PTL 1] JP 2013-82610 A

SUMMARY OF INVENTION

Technical Problem

The above-mentioned carbon nanotubes are expensive as compared to an inorganic pigment. Because of this, when a part of the carbon nanotubes can be replaced by the inorganic pigment while the shielding property against an electromagnetic wave is ensured, an electromagnetic wave shielding sheet having low cost can be produced.

One of the objects according to some aspects of the present invention is to provide a method of producing an electromagnetic wave shielding sheet having a high shielding property against an electromagnetic wave and having low cost. In addition, one of the objects according to some aspects of the present invention is to provide an electromagnetic wave shielding sheet having a high shielding property against an electromagnetic wave and having low cost.

Solution to Problem

According to one aspect of the present invention, there is provided a method of producing an electromagnetic wave shielding sheet, including:
  preparing a dispersion containing carbon nanotubes, an inorganic pigment, sodium carboxymethyl cellulose, and water; and
  drying the dispersion,
    a ratio of a mass of the inorganic pigment to a mass of the carbon nanotubes in the dispersion being 1/4 or more and 1 or less.

In the above aspect of the method of producing an electromagnetic wave shielding sheet, the inorganic pigment may be kaolin.

In any of the above aspects of the method of producing an electromagnetic wave shielding sheet, a ratio of a mass of the sodium carboxymethyl cellulose to a sum of the mass of the carbon nanotubes and the mass of the inorganic pigment in the dispersion may be 3 or less.

In any of the above aspects of the method of producing an electromagnetic wave shielding sheet, only the sodium carboxymethyl cellulose may be used as a dispersant in the step of preparing the dispersion.

In any of the above aspects of the method of producing an electromagnetic wave shielding sheet, the preparing the dispersion may include:
  preparing mixed liquids by mixing the carbon nanotubes, the sodium carboxymethyl cellulose, and the water; and
  dispersing the carbon nanotubes contained in the mixed liquid by an aqueous counter collision method.

According to one aspect of the present invention, there is provided an electromagnetic wave shielding sheet, including carbon nanotubes, an inorganic pigment, and sodium carboxymethyl cellulose,
  wherein a ratio of a mass of the inorganic pigment to a mass of the carbon nanotubes is 1/4 or more and 1 or less.

In the above aspect of the electromagnetic wave shielding sheet, the inorganic pigment may be kaolin.

In any of the above aspects of the electromagnetic wave shielding sheet, a ratio of a mass of the sodium carboxymethyl cellulose to a sum of the mass of the carbon nanotubes and the mass of the inorganic pigment may be 3 or less.

Advantageous Effects of Invention

According to the method of producing an electromagnetic wave shielding sheet according to the present invention, the electromagnetic wave shielding sheet having a high shielding property against an electromagnetic wave and having low cost can be produced. In addition, the electromagnetic wave shielding sheet according to the present invention can have a high shielding property against an electromagnetic wave and have low cost.

BRIEF DESCRIPTION OF DRAWINGS

FIG. 2 is a table for showing inorganic pigments used in experimental examples.

FIG. 3 is a table for showing evaluation results of an electromagnetic wave shielding property of coated paper.

FIG. 4 is a table for showing evaluation results of an electromagnetic wave shielding property of a dry film.

FIG. 11 is a table for showing evaluation results of dispersibility of dispersions 1 to 12.

FIG. 13 is a table for showing evaluation results of an electromagnetic wave shielding property when a ratio between carbon nanotubes and sodium carboxymethyl cellulose is changed.

FIG. 16 is a table for showing evaluation results of an electromagnetic wave shielding property when the number of passes is changed

FIG. 19 is a table for showing evaluation results of electromagnetic wave noise suppression performance of coated paper.

DESCRIPTION OF EMBODIMENTS

Preferred embodiments of the present invention are described in detail below with reference to the drawings. The embodiments described below do not unduly limit the scope of the present invention as stated in the claims. In addition, all of the elements described below should not necessarily be taken as essential elements of the present invention.

1. METHOD OF PRODUCING ELECTROMAGNETIC WAVE SHIELDING SHEET

Figure 1:
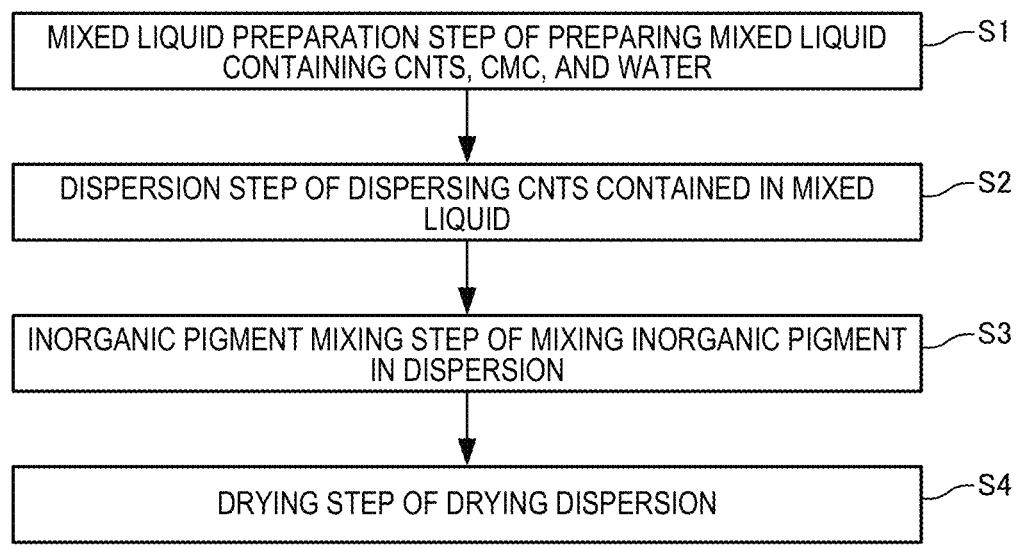
FIG. 1 is a flowchart for illustrating a method of producing an electromagnetic wave shielding sheet according to an embodiment of the present invention.

First, a method of producing an electromagnetic wave shielding sheet according to an embodiment of the present invention is described with reference to the drawings. FIG. 1 is a flowchart for illustrating the method of producing an electromagnetic wave shielding sheet according to this embodiment.

The method of producing an electromagnetic wave shielding sheet according to this embodiment includes a dispersion preparation step of preparing a dispersion containing carbon nanotubes (hereinafter sometimes referred to as "CNTs"), an inorganic pigment, sodium carboxymethyl cellulose (hereinafter sometimes referred to as "CMC"), and water. As illustrated in FIG. 1, the dispersion preparation step includes, for example, a mixed liquid preparation step (Step S1) of preparing a mixed liquid by mixing CNTs, CMC, and water, a dispersion step (Step S2) of dispersing the CNTs contained in the mixed liquid by an aqueous counter collision method, and an inorganic pigment mixing step (Step S3) of mixing an inorganic pigment in the dispersion. Further, the method of producing an electromagnetic wave shielding sheet according to this embodiment includes a drying step (Step S4) of drying the dispersion. The respective steps of the method of producing an electromagnetic wave shielding sheet according to this embodiment are described below in sequence.

1.1. Mixed Liquid Preparation Step (Step S1)

1.1.1. Carbon Nanotubes (CNTs)

Examples of the CNTs used in the mixed liquid preparation step include: single-walled carbon nanotubes (SWNTs) in which one six-membered ring network (graphene sheet) made of carbon is wound into a cylindrical shape; and multi-walled carbon nanotubes (MWNTs) in which a plurality of graphene sheets are wound into a concentrical shape. In the mixed liquid preparation step, only one or both of the SWNTs and the MWNTs may be used, but it is preferred to use only the MWNTs as the CNTs in consideration of the dispersibility of the CNTs.

The above-mentioned CNTs are produced in a preferred size, for example, by an arc discharge method, a laser ablation method, a chemical vapor deposition (CVD) method, or the like. The CNTs used in the mixed liquid preparation step may be produced by any of the methods.

The diameter of the CNTs is not particularly limited, but is preferably 1 nm or more and 100 nm or less, more preferably 5 nm or more and 50 nm or less, still more preferably 8 nm or more and 15 nm or less. When the diameter of the CNTs falls within the above-mentioned ranges, a dispersion having satisfactory dispersibility can be prepared. The diameter of the CNTs may be measured with a scanning electron microscope (SEM).

The fiber length of the CNTs is not particularly limited, but is preferably 0.5 μm or more and 50 μm or less, more preferably 15 μm or more and 35 μm or less. When the fiber length of the CNTs falls within the above-mentioned ranges, a dispersion having satisfactory dispersibility can be prepared. The fiber length of the CNTs may be measured with the SEM. The "fiber length of the CNTs" is the length in a state in which the CNTs are tied in bunch (bundled) with a van der Waals' force, and is the length of the CNTs before being dispersed in a solvent.

The BET specific surface area of the CNTs is not particularly limited, but is preferably 50 m$^2$/g or more and 500 m$^2$/g or less, more preferably 100 m$^2$/g or more and 300 m$^2$/g or less. When the BET specific surface area of the CNTs falls within the above-mentioned ranges, a dispersion having satisfactory dispersibility can be prepared. The "BET specific surface area" is a specific surface area measured by a Brunauer Emmett Teller (BET) method, and may be measured with an automatic specific surface area measuring device.

The content of the CNTs in the mixed liquid is not particularly limited, but is preferably 0.1 mass % or more and 10.0 mass % or less, more preferably 0.5 mass % or more and 5.0 mass % or less, still more preferably 1.0 mass % or more and 3.0 mass % or less. When the content of the CNTs is 0.1 mass % or more, an electromagnetic wave shielding sheet having a high shielding property (electromagnetic wave shielding property) against an electromagnetic wave can be produced. Further, when the content of the CNTs is 5.0 mass % or less, a dispersion having satisfactory dispersibility can be prepared.

1.1.2. Sodium Carboxymethyl Cellulose (CMC)

In the mixed liquid preparation step, the CMC is used as a dispersant. Herein, the "dispersant" refers to an additive that disperses the CNTs in water, to thereby contribute to prevention of aggregation and sedimentation of the CNTs.

In the mixed liquid preparation step, it is preferred that only the CMC be used as the dispersant. That is, it is preferred that the mixed liquid prepared in the mixed liquid preparation step do not contain an additive, other than the CMC, which contributes to prevention of aggregation and sedimentation of the CNTs. Through use of only the CMC as the dispersant, the mixing of air bubbles or the like can be prevented as compared to, for example, the case in which an anionic surfactant or the like is added as the dispersant in addition to the CMC. Accordingly, a mixed liquid can be easily prepared, and an electromagnetic wave shielding sheet having no air bubbles mixed therein can be produced in the drying step described later.

The weight average molecular weight of the CMC is not particularly limited, but is preferably 5,000 or more and 100,000 or less, more preferably 10,000 or more and 60,000 or less, still more preferably 10,000 or more and 35,000 or less. When the weight average molecular weight of the CMC is 5,000 or more, the CMC is easily entangled with the CNTs, and the dispersibility of the CNTs is improved. However, when the weight average molecular weight is too large, the dispersibility deteriorates conversely, and hence the molecular weight of the CMC is preferably 100,000 or less. The "weight average molecular weight" as used herein refers to a weight average molecular weight in terms of polystyrene measured by gel permeation chromatography (GPC).

The degree of etherification of the CMC is not particularly limited, but is preferably 0.6 or more and 1.2 or less, more preferably 0.6 or more and 0.8 or less. When the degree of etherification of the CMC falls within the above-mentioned ranges, a dispersion having satisfactory dispersibility can be prepared.

In the mixed liquid, the content of the CMC is not particularly limited, but is preferably 0.1 mass % or more and 10.0 mass % or less, more preferably 0.5 mass % or more and 5.0 mass % or less, still more preferably 1.0 mass % or more and 3.0 mass % or less.

In the mixed liquid, a ratio $M_{CMC}/M_{SUM}$ of a mass $M_{CMC}$ of the CMC to a sum $M_{SUM}$ of a mass of the CNTs and a mass of the inorganic pigment is preferably 1/7 or more, more preferably 1/6 or more. When the ratio $M_{CMC}/M_{SUM}$ is 1/7 or more, a dispersion having satisfactory dispersibility can be prepared (see "3. Experimental Examples" described later for details).

In the mixed liquid, the ratio $M_{CMC}/M_{SUM}$ is preferably 3 or less, more preferably 1 or less. When the ratio $M_{CMC}/M_{SUM}$ is 3 or less, an electromagnetic wave shielding sheet having a high electromagnetic wave shielding property can be produced (see "3. Experimental Examples" described later for details).

1.1.3. Water

In the mixed liquid preparation step, water is used as a solvent. Examples of the water include pure water, such as ion-exchanged water, ultra-filtered water, reverse osmosis water, or distilled water, and ultrapure water in which ionic impurities are removed to the extent possible. Through use of water as the solvent, an environment-friendly mixed liquid can be prepared as compared to the case in which an organic solvent is used as the solvent. In the mixed liquid preparation step, the mixed liquid may be prepared by mixing only CNTs, CMC, and water. That is, the mixed liquid may contain only CNTs, CMC, and water.

1.2. Dispersion Step (Step S2)

In the dispersion step, the CNTs contained in the mixed liquid are dispersed by the aqueous counter collision method. When the CNTs contained in the mixed liquid are dispersed by the aqueous counter collision method, the CNTs can be dispersed with satisfactory dispersibility even when the mixed liquid contains only the CMC as a dispersant. Because of this, a dispersion having satisfactory dispersibility can be prepared.

The "aqueous counter collision method" in this embodiment involves ejecting mixed liquids containing CNTs at high pressure from a pair of nozzle holes (first nozzle hole and second nozzle hole) arranged so as to be opposed to each other and causing the mixed liquid ejected from the first nozzle hole and the mixed liquid ejected from the second nozzle hole to collide with each other to disperse the CNTs. In the aqueous counter collision method, it is preferred that the CNTs contained in the mixed liquid ejected from the first nozzle hole and the CNTs contained in the mixed liquid ejected from the second nozzle hole be caused to collide with each other to disperse the CNTs. In the aqueous counter collision method, when the central axis of the first nozzle hole and the central axis of the second nozzle hole intersect with each other, both the central axes may be on a straight line or may be inclined to each other.

In the aqueous counter collision method in the dispersion step, the mixed liquids are ejected from nozzle holes each having a diameter of preferably 50 μm or more and 200 μm or less, more preferably 80 μm or more and 120 μm or less, still more preferably 100 μm, and the mixed liquids are caused to collide with each other. When the diameter of the nozzle hole is 50 μm or more, even a mixed liquid having a high viscosity can be ejected from the nozzle hole. Further, when the diameter of the nozzle hole is 200 μm or less, the collision energy between the mixed liquids can be increased.

In the aqueous counter collision method in the dispersion step, the mixed liquids are ejected at a pressure of preferably 150 MPa or more and 250 MPa or less, more preferably 180 MPa or more and 220 MPa or less, still more preferably 200 MPa, and the mixed liquids are caused to collide with each other. When the pressure is 150 MPa or more, the collision energy between the mixed liquids can be increased. Further, when the pressure is 250 MPa or less, it is possible to suppress the situation in which the collision energy becomes too high, and the fibers of the CNTs are broken, with the result that the viscosity of a dispersion is decreased.

Specifically, the aqueous counter collision method in the dispersion step is performed through use of a wet atomizing device "Star Burst Labo" (model name: HJP-25005) manufactured by Sugino Machine Limited. The wet atomizing device has a high energy density as compared to, for example, an ultrasonic homogenizer or a ball mill and can produce a dispersion having satisfactory dispersibility in a short period of time. Further, the wet atomizing device can minimize the mixing of impurities, and can produce a dispersion having extremely little mixing of impurities.

The number of passes of the mixed liquid in the wet atomizing device is preferably 1 time or more and 40 times or less, more preferably 2 times or more and 10 times or less, still more preferably 2 times or 3 times. When the number of passes is 40 times or less, it is possible to suppress the situation in which the collision between the mixed liquids breaks the fibers of the CNTs to decrease the viscosity of the dispersion. In addition, when the number of passes is 2 times or more, the CNTs can be dispersed with satisfactory uniformity. Further, when the number of passes is 2 times or more, no significant difference is recognized in shielding property against an electromagnetic wave. Accordingly, when the number of passes is 2 times or more and 10 times or less, the treatment time with the wet atomizing device can be shortened while the dispersibility and the electromagnetic wave shielding property are kept.

Herein, the "number of passes of the mixed liquid in the wet atomizing device" refers to the number of circulations of the mixed liquid in the wet atomizing device, and for example, the phrase "number of passes is 2 times" means that the mixed liquid is circulated twice so that the CNTs which have collided once collide again. As described above, the number of passes corresponds to the number of collisions of the CNTs contained in the mixed liquid. Further, the number of passes is proportional to the treatment time in the wet pulverization and dispersion device. When the treatment time in the wet pulverization and dispersion device is long, the number of circulations of the mixed liquid is increased.

As long as a dispersion having satisfactory dispersibility can be prepared, and an electromagnetic wave shielding sheet having a high electromagnetic wave shielding property can be produced, the device used in the aqueous counter collision method in the dispersion step is not limited to the above-mentioned wet pulverization and dispersion device "Star Burst Labo". In addition, as long as a dispersion having satisfactory dispersibility can be prepared, and an electromagnetic wave shielding sheet having a high electromagnetic wave shielding property can be produced, the aqueous counter collision method may not be used in the dispersion step.

In addition, it is preferred to treat the mixed liquid with a homogenizer as pretreatment before performing the dispersion step. The homogenizer may be an ultrasonic type that causes cavitation with an ultrasonic wave, a stirring type that stirs the mixed liquid, or a pressure type that applies a pressure to the mixed liquid. Through the treatment with the homogenizer, aggregates formed by the CNTs can be reduced, and the dispersion step can be smoothly performed.

1.3. Inorganic Pigment Mixing Step (Step S3)

In the inorganic pigment mixing step, an inorganic pigment is mixed with the dispersion prepared in the dispersion step to prepare a dispersion containing the CNTs, the inorganic pigment, the CMC, and the water. A method of mixing the inorganic pigment is not particularly limited, but is performed through use of, for example, a homogenizer in the same manner as in the pretreatment of the dispersion step. The inorganic pigment refers to a chemically inorganic pigment, which is a pigment prepared from an oxide or the like obtained by a chemical reaction of natural ore and metal.

The inorganic pigment is preferably kaolin. When the inorganic pigment is kaolin, the electromagnetic wave shielding property of the electromagnetic wave shielding sheet tends to be high as compared to the case in which the inorganic pigment is light calcium carbonate or heavy calcium carbonate (see "3. Experimental Examples" described later for details).

In the dispersion prepared in the inorganic pigment mixing step, a ratio $M_{COL}/M_{CNT}$ of a mass $M_{COL}$ of the inorganic pigment to a mass $M_{CNT}$ of the CNTs is a 1/4 or more and 1 or less, preferably 1/4 or more and 1/2 or less. When the ratio $M_{COL}/M_{CNT}$ is 1/4 or more, the proportion of the CNTs is small, and hence an electromagnetic wave shielding sheet having low cost can be produced. Further, when the ratio $M_{COL}/M_{CNT}$ is 1 or less, an electromagnetic wave shielding sheet having a high electromagnetic wave shielding property can be produced. When the ratio $M_{COL}/M_{CNT}$ is more than 1, the proportion of the CNTs becomes too small, with the result that the electromagnetic wave shielding property becomes low (see "3. Experimental Examples" described later for details).

When the inorganic pigment is mixed in the inorganic pigment mixing step, the viscosity of the dispersion can be increased. Because of this, when an electromagnetic wave shielding sheet is produced, the adhesion of the dispersion to a roller can be facilitated. The electromagnetic wave shielding sheet is produced by, for example, a method involving causing the dispersion to adhere to a roller through use of a roll coater and transferring the dispersion onto a base material, such as paper, by the roller. When the viscosity of the dispersion is low, it becomes difficult to cause the dispersion to adhere to the roller. The viscosity of the dispersion can be increased by mixing the inorganic pigment, and hence the adhesion of the dispersion to the roller can be facilitated even without separate use of a thickener.

When the viscosity of the dispersion is to be further increased, a thickener may be mixed with the dispersion. Examples of the thickener include: celluloses, such as methyl cellulose and hydroxypropyl cellulose, and ammonium salts or alkali metal salts thereof; polycarboxylic acids, such as poly(meth)acrylic acid and modified poly(meth)acrylic acid, and alkali metal salts thereof; polyvinyl alcohol-based (co)polymers, such as polyvinyl alcohol, modified polyvinyl alcohol, and an ethylene-vinyl alcohol copolymer; saponified products of copolymers of unsaturated carboxylic acids, such as (meth)acrylic acid, maleic acid, and fumaric acid, and vinyl esters; and water-soluble polymers, such as a polyacrylamide-based copolymer.

In addition, the method of producing the electromagnetic wave shielding sheet is not limited to the method involving using the roll coater, and the sheet may be produced by a method involving directly applying the dispersion onto a base material by using, for example, a wire bar coater, a knife coater, an air knife coater, a blade coater, a reverse roll coater, or a die coater.

The viscosity of the dispersion prepared in the inorganic pigment mixing step is not particularly limited, but is preferably 100 mPa·s or more and 3,000 mPa·s or less at 20° C. When the viscosity of the dispersion is 100 mPa·s or more, the dispersion is easily applied to the base material through use of the roller as described above. Further, when the viscosity of the dispersion is 3,000 mPa·s or less, the mixed liquid is easily ejected from nozzle holes of the wet pulverization and dispersion device in the above-mentioned dispersion step. The viscosity of the dispersion may be measured with a viscometer.

The dispersion prepared in the inorganic pigment mixing step may contain only the CNTs, the inorganic pigment, the CMC, and the water, or may contain additives in addition to the CNTs, the inorganic pigment, the CMC, and the water. Examples of such additives include a preservative and a pH adjuster.

A ratio $M_{CMC}/M_{SUM}$ of a mass $M_{CMC}$ of the CMC to a sum $M_{SUM}$ of a mass of the CNTs and a mass of the inorganic pigment contained in the dispersion prepared in the inorganic pigment mixing step is the same as the ratio $M_{CMC}/M_{SUM}$ in the above-mentioned mixed liquid.

1.4. Drying Step (Step S4)

In the drying step, the dispersion prepared in the inorganic pigment mixing step is dried. As a result, the moisture of the dispersion can be evaporated to produce an electromagnetic wave shielding sheet. A method of drying the dispersion is not particularly limited, and the dispersion may be dried by a heat plate, a heater, or the like, or may be naturally dried.

In the drying step, an electromagnetic wave shielding sheet may be produced by putting the dispersion in a petri dish or the like and then drying the dispersion.

Alternatively, in the drying step, the electromagnetic wave shielding sheet may be produced by applying the dispersion to a base material, such as paper, and drying the applied dispersion. A method of applying the dispersion to the base material is not particularly limited, but for example, there are given a method involving directly applying the dispersion to the base material through use of a wire bar coater, a knife coater, an air coater, a blade coater, a reverse roll coater, a die coater, or the like, a method involving causing the dispersion to adhere to a roller and transferring the dispersion adhering to the roller to the base material, such as a so-called roll coater, and the like.

1.5. Modification Example

In the foregoing, description has been given of the example in which the dispersion preparation step of preparing the dispersion includes the mixed liquid preparation step (Step S1) of preparing a mixed liquid by mixing CNTs. CMC, and water, the dispersion step (Step S2) of dispersing the CNTs contained in the mixed liquid by an aqueous counter collision method, and the inorganic pigment mixing step (Step S3) of mixing the inorganic pigment with the dispersion prepared in the dispersion step. However, the dispersion preparation step is not limited to this example.

In the dispersion preparation step, for example, CNTs, an inorganic pigment. CMC, and water may be mixed to prepare a mixed liquid, and the mixed liquid may be subjected to an aqueous counter collision method to disperse the CNTs. Alternatively, in the dispersion preparation step, for example, powder of an inorganic pigment and powder of CMC may be put in and mixed with a CNT-containing liquid subjected to the aqueous counter collision method to prepare a dispersion in which the CNTs are dispersed.

2. ELECTROMAGNETIC WAVE SHIELDING SHEET

Next, an electromagnetic wave shielding sheet according to an embodiment of the present invention is described. The electromagnetic wave shielding sheet according to this embodiment is an electromagnetic wave shielding sheet produced by the above-mentioned "1. Method of Producing Electromagnetic Wave Shielding Sheet". Accordingly, the electromagnetic wave shielding sheet according to this embodiment includes CNTs, an inorganic pigment, and CMC, and the ratio of the mass of the inorganic pigment to the mass of the CNTs is 1/4 or more and 1 or less. The electromagnetic wave shielding sheet according to this embodiment may be formed of CNTs, an inorganic pigment, and CMC.

In addition, a ratio $M_{CMC}/M_{SUM}$ of a mass $M_{CMC}$ of the CMC to a sum $M_{SUM}$ of the mass of the CNTs and the mass of the inorganic pigment contained in the electromagnetic wave shielding sheet according to this embodiment is the same as the ratio $M_{CMC}/M_{SUM}$ in the dispersion prepared in the inorganic pigment mixing step. The mass ratio of the components of such electromagnetic wave shielding sheet may be measured by mass spectrometry.

The electromagnetic wave shielding sheet according to this embodiment has a shape in which the size in a direction orthogonal to a thickness direction is sufficiently large with respect to the thickness. The shape of the electromagnetic wave shielding sheet is not particularly limited when viewed from the thickness direction, but is, for example, a circle, an ellipse, or a polygon, such as a quadrangle.

The thickness of the electromagnetic wave shielding sheet according to this embodiment is not particularly limited, but is preferably 0.1 µm or more and 500 µm or less, more preferably 1 µm or more and 300 µm or less. The thickness of the electromagnetic wave shielding sheet may be measured with the SEM. When the thickness of the electromagnetic wave shielding sheet is 0.1 µm or more, the electromagnetic wave shielding property of the electromagnetic wave shielding sheet can be increased. Further, when the thickness of the electromagnetic wave shielding sheet is 500 µm or less, the occurrence of cracks in the electromagnetic wave shielding sheet can be suppressed.

The electromagnetic wave shielding sheet according to this embodiment is not particularly limited, but has, for example, a high shielding property against a frequency of 10 MHz or more and 100 GHz or less. The shielding property of the electromagnetic wave shielding sheet is evaluated by, for example, a coaxial tube method, a free space method, a microstrip line method, a Kansai Electronic Industry Development Center (KEC) method, or the like.

3. EXPERIMENTAL EXAMPLES

The present invention is more specifically described below by way of experimental examples. The present invention is not limited to the following experimental examples.

3.1. First Experimental Example 3.1.1. Production of Electromagnetic Wave Shielding Sheet First, a mixed liquid was prepared by mixing CNTs, CMC, and water. A homogenizer "Biomixer BM-2" manufactured by NISSEI Corporation was used for the mixing. A treatment time for the mixing was set to 5 minutes.

As the CNTs, "K-Nanos-100P" manufactured by Kumho Petrochemical Co., Ltd. was used. The CNTs are MWNTs each having a diameter of from 8 nm to 15 nm, a fiber length of 27 µm (bundle), and a BET specific surface area of 220 $m^2/g$.

As the CMC. "Cellogen 5A" manufactured by DKS Co. Ltd. was used. The CMC has a weight average molecular weight of from 11,000 to 15,000, and a degree of etherification of 0.7. Only the CMC was used as a dispersant. No additives, such as a thickener, were added.

Next, the aqueous counter collision method was performed on the above-mentioned mixed liquid. The aqueous counter collision method was performed through use of a wet pulverization and dispersion device "Star Burst Labo" (model name: HJP-25005) manufactured by Sugino Machine Limited. The diameter of each nozzle hole from which the mixed liquid was ejected was set to 100 µm, and the ejected pressure of the mixed liquid was set to 200 MPa. The number of passes of the mixed liquid with the wet pulverization and dispersion device was set to 2 times. Thus, a dispersion containing the CNTs, the CMC, and the water was prepared.

Next, an inorganic pigment was put in and mixed with the above-mentioned dispersion to prepare a dispersion containing the inorganic pigment. As a result, a dispersion containing the CNTs, the inorganic pigment, the CMC, and the water was prepared. A homogenizer "Biomixer BM-2" manufactured by NISSEI Corporation was used for the mixing. A treatment time for the mixing was set to 5 minutes.

The dispersion containing the inorganic pigment was prepared so that the ratio of the mass of the CMC to the sum of the mass of the CNTs and the mass of the inorganic pigment was 1 ((CNT+inorganic pigment):CMC=1:1). In addition, the dispersion was prepared so that the sum of the content of the CNTs, the content of the inorganic pigment, and the content of the CMC was 5 mass %.

In this experimental example, six kinds of inorganic pigments were used. FIG. 2 is a table for showing the inorganic pigments used in this experimental example. In FIG. 2 and the subsequent figures, light calcium carbonate is referred to as "light calcium", and heavy calcium carbonate is referred to as "heavy calcium".

In addition, the ratio of the mass of the inorganic pigment to the mass of the CNTs was changed in the range of from 1/4 to 4 (CNT:inorganic pigment=4:1 to 1:4).

The above-mentioned dispersion was applied to paper ("µ Coat Neos" (trademark) manufactured by Hokuetsu Corporation having a basis weight of 157 g/m$^2$) through use of a roll coater. Then, the resultant was dried at 120° C. for 3 minutes to evaporate moisture, to thereby produce coated paper.

As described above, the coated paper serving as an electromagnetic wave shielding sheet was produced.

Further, coated paper containing no inorganic pigment was produced. The coated paper did not contain an inorganic pigment, and hence the content of the CNTs was increased accordingly so that the sum of the content of the CNTs and the content of the CMC was 5 mass % in the dispersion.

Further, the above-mentioned dispersion without being applied to paper was put in a petri dish and dried at 50° C. overnight to evaporate moisture, to thereby produce a dry film serving as an electromagnetic wave shielding sheet. That is, the dry film is not applied to a base material, such as paper.

3.1.2. Evaluation of Electromagnetic Wave Shielding Property (1) Evaluation Method In the coaxial tube method, the electromagnetic wave shielding property of each of the coated paper and the dry film was evaluated by measuring "S21". The "S21" corresponds to a transmission loss. When the absolute value of the "S21" is larger, the electromagnetic wave shielding property is higher. As a testing machine, a network analyzer "ZVA67" manufactured by Rohde & Schwarz and shield effect measurement kits "S-39D" and "S-GPC7" manufactured by Keycom Corporation were used. The measurement frequency was set to from 45 MHz to 18 GHz.

(2) Evaluation Results

FIG. 3 is a table for showing the evaluation results of the electromagnetic wave shielding property of the coated paper. FIG. 4 is a table for showing the evaluation results of the electromagnetic wave shielding property of the dry film. In each of FIG. 3 and FIG. 4, "S21" at frequencies of 300 MHz and 7 GHz is shown. In the description in FIG. 3, FIG. 4, and the subsequent figures, "Contour 1500", "Hydrogloss 90", "Brilliant-15", "Tamapearl TP112", "Softon 1500", and "Softon 2200" in FIG. 2 are referred to as "kaolin 1", "kaolin 2", "light calcium 1", "light calcium 2", "heavy calcium 1", and "heavy calcium 2", respectively. In addition, in the description in FIG. 3, FIG. 4, and the subsequent figures, the coated paper and the dry film each containing CNTs without containing an inorganic pigment are referred to as "Only CNT".

In addition, in FIG. 3, the thickness of the coated paper is shown. In FIG. 3, the "thickness" indicates a value obtained by subtracting the thickness of the paper that is the base material from the total thickness of the coated paper. In addition, in FIG. 4, the thickness of the dry film is shown. In FIG. 4, the "thickness" is the thickness of the entire dry film. The thickness was measured by SEM.

Figure 5:
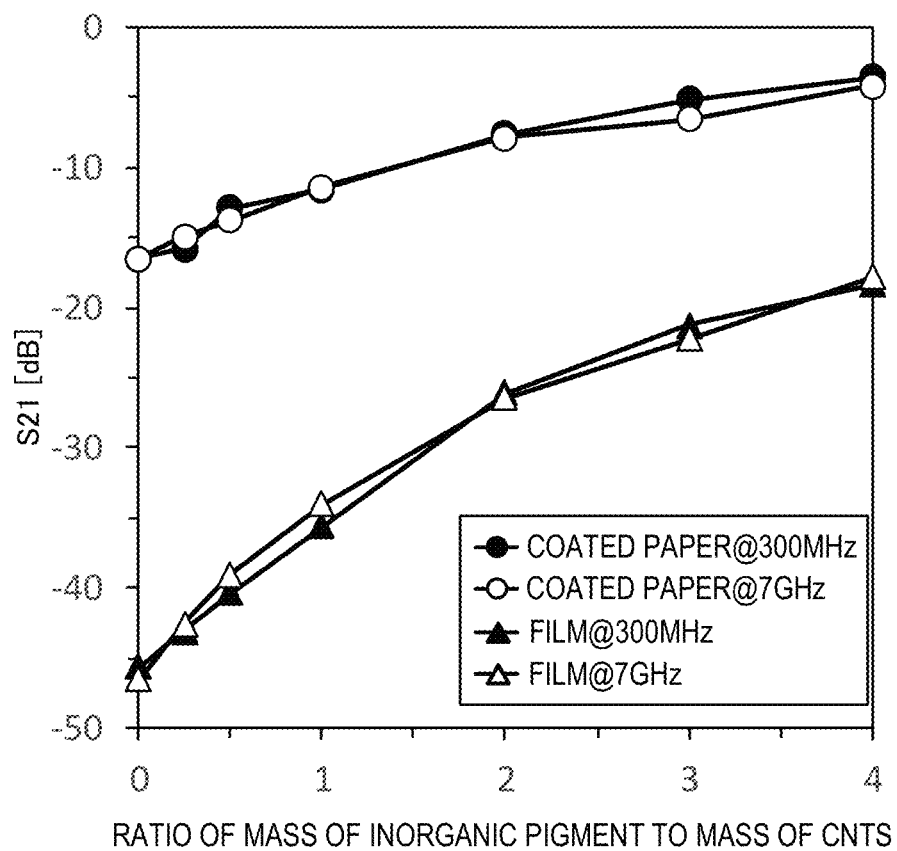
FIG. 5 is a graph for showing a relationship between a ratio of a mass of an inorganic pigment to a mass of carbon nanotubes and "S21" when kaolin is used as the inorganic pigment.
Figure 6:
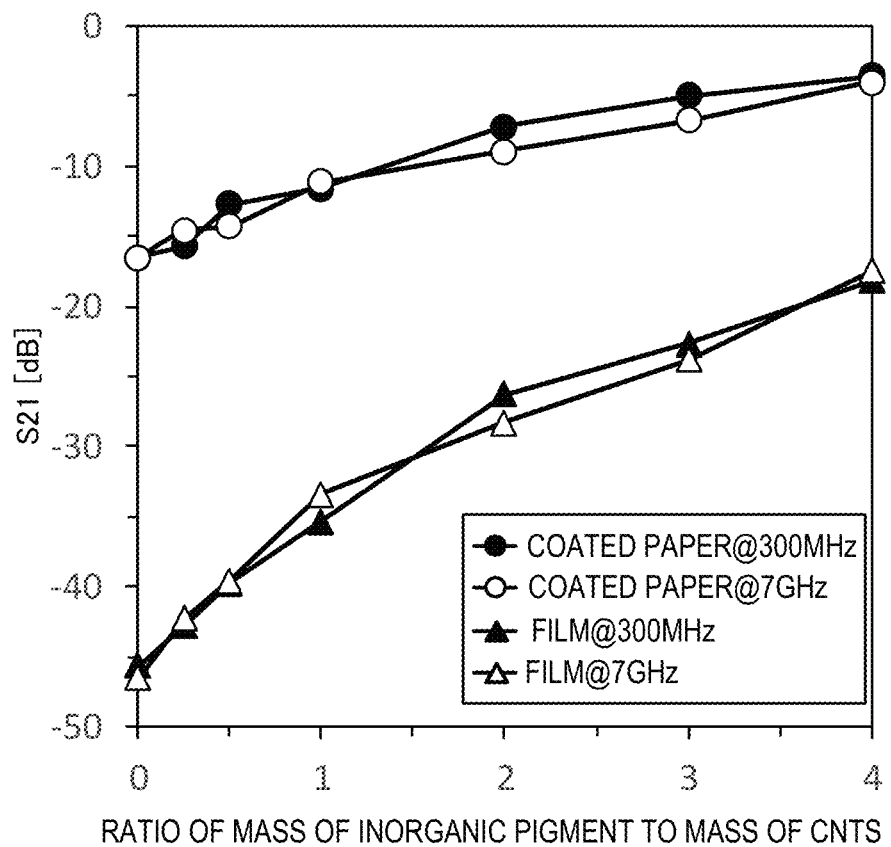
FIG. 6 is a graph for showing a relationship between a ratio of a mass of an inorganic pigment to a mass of carbon nanotubes and "S21" when kaolin is used as the inorganic pigment.
Figure 7:
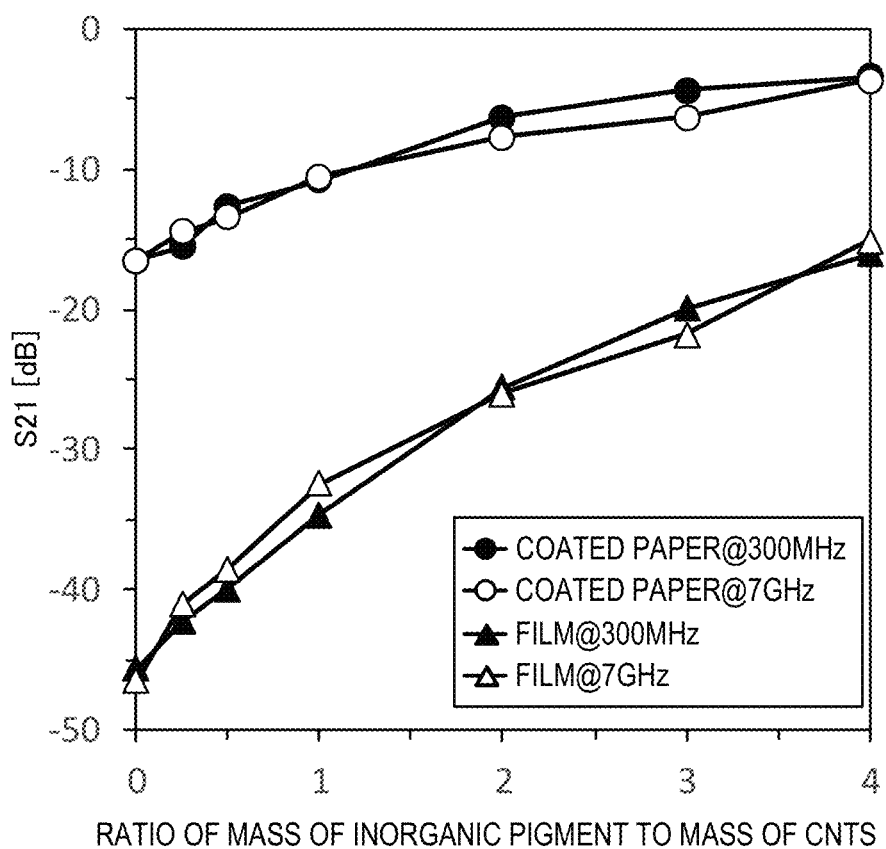
FIG. 7 is a graph for showing a relationship between a ratio of a mass of an inorganic pigment to a mass of carbon nanotubes and "S21" when light calcium carbonate is used as the inorganic pigment.
Figure 8:
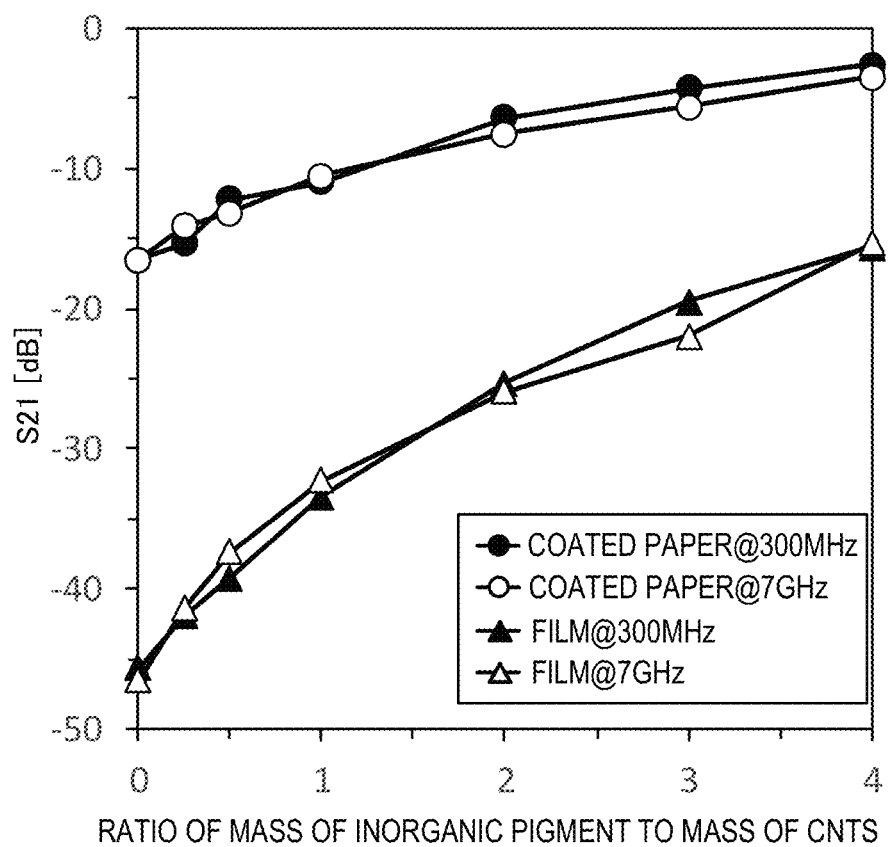
FIG. 8 is a graph for showing a relationship between a ratio of a mass of an inorganic pigment to a mass of carbon nanotubes and "S21" when light calcium carbonate is used as the inorganic pigment.
Figure 9:
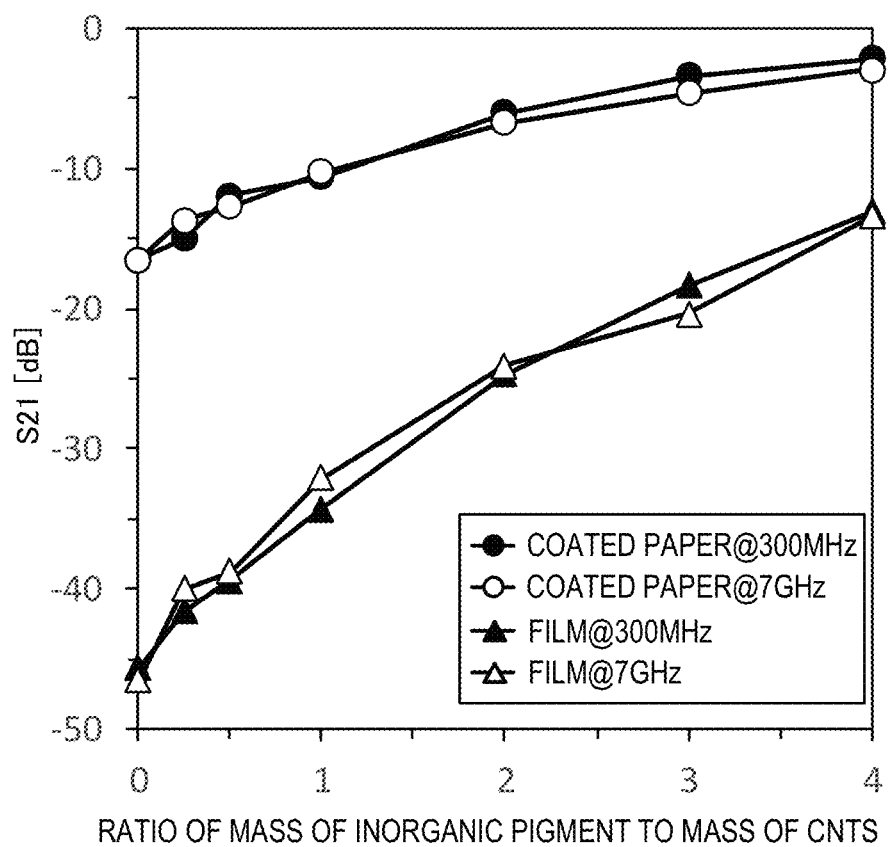
FIG. 9 is a graph for showing a relationship between a ratio of a mass of an inorganic pigment to a mass of carbon nanotubes and "S21" when heavy calcium carbonate is used as the inorganic pigment.
Figure 10:
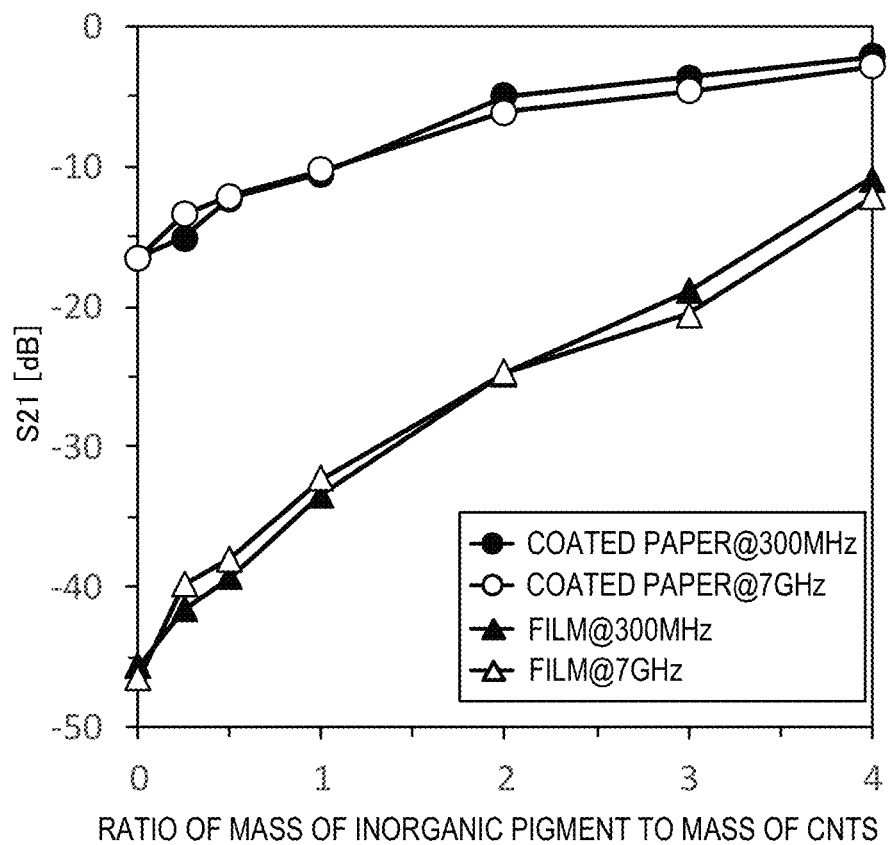
FIG. 10 is a graph for showing a relationship between a ratio of a mass of an inorganic pigment to a mass of carbon nanotubes and "S21" when heavy calcium carbonate is used as the inorganic pigment.

In addition, FIG. 5 to FIG. 10 are each a graph for showing a relationship between the ratio of the mass of the inorganic pigment to the mass of the CNTs and the "S21". In FIG. 5, the evaluation results of kaolin 1 are shown. In FIG. 6, the evaluation results of kaolin 2 are shown. In FIG. 7, the evaluation results of light calcium 1 are shown. In FIG. 8, the evaluation results of light calcium 2 are shown. In FIG. 9, the evaluation results of heavy calcium 1 are shown. In FIG. 10, the evaluation results of heavy calcium 2 are shown.

As shown in FIG. 3 to FIG. 10, when the ratio of the mass of the inorganic pigment to the mass of the CNTs is increased, the absolute value of the "S21" is decreased. Here, as the electromagnetic wave shielding property, the following is one indicator. The absolute value of the "S21" is 10 dB or more at a thickness of from 3 µm to 4 µm, and the absolute value of the "S21" is 30 dB or more at a thickness of from 130 µm to 155 µm.

As shown in FIG. 3, in the coated paper, when the ratio of the mass of the inorganic pigment to the mass of the CNTs was 1/4 or more and 1 or less (CNT:inorganic pigment=1: 0.25 to 1:1), the absolute value of the "S21" was 10 dB or more at a thickness of from 3 µm to 4 µm. Further, as shown in FIG. 4, in the dry film, when the ratio of the mass of the inorganic pigment to the mass of the CNTs was 1/4 or more and 1 or less, the absolute value of the "S21" was 30 dB or more at a thickness of from 130 µm to 155 µm. Accordingly, it was found that, when the ratio of the mass of the inorganic pigment to the mass of the CNTs was 1/4 or more and 1 or less, the above-mentioned indicator of the electromagnetic wave shielding property was able to be satisfied, and even when a part of the CNTs was replaced by the inorganic pigment, a significant decrease in electromagnetic wave shielding property was able to be prevented.

Further, as shown in FIG. 3 to FIG. 10, it was found that the kaolins 1 and 2 each had a large absolute value of the "S21" as compared to those of the light calciums 1 and 2 and the heavy calciums 1 and 2 and enabled an electromagnetic wave shield sheet having a high electromagnetic wave shielding property to be produced.

3.1.3. Evaluation of Film-Forming Property of Dry Film

The film-forming property of the above-mentioned dry film was evaluated. The specific evaluation criteria are as follows:

A: No cracks and waviness occurred.
B: No cracks occurred, but waviness occurred.
C: Cracks occurred.

The "waviness" means a state in which the film undulates like a wave, although the wave does not lead to cracks.

In FIG. 4, the evaluation results of the film-forming property of the dry film are shown. As shown in FIG. 4, the kaolins 1 and 2 each had a satisfactory film-forming property as compared to those of the light calciums 1 and 2 and the heavy calciums 1 and 2. Further, as shown in FIG. 4, when the ratio of the mass of the inorganic pigment to the mass of the CNTs was increased, the film-forming property tended to deteriorate.

From the above-mentioned evaluation, it was found that there was a correlation between the electromagnetic wave shielding property and the film-forming property, and that the electromagnetic wave shielding property tended to be high when the film-forming property became more satisfactory.

3.2. Second Experimental Example

In the above-mentioned first experimental example, the dispersion containing an inorganic pigment was prepared. However, in the second experimental example, a dispersion containing only CNTs, CMC, and water was prepared without using an inorganic pigment, and the dispersibility and electromagnetic shielding property were evaluated.

Both the CNTs and the inorganic pigment are inorganic materials, and the evaluation results of the second experimental example can be applied to the description of the dispersibility of a dispersion containing CNTs, an inorganic pigment, CMC, and water, and the electromagnetic wave shielding property of an electromagnetic wave shielding sheet produced from the dispersion. The evaluation of the dispersibility and the electromagnetic wave shielding property are described below in sequence.

3.2.1. Evaluation of Dispersibility of CNTs
(1) Preparation of Dispersion

A mixed liquid was prepared by mixing only CNTs. CMC, and water. The sum of the content of the CNTs and the content of the CMC in the mixed liquid was set to 5 mass %. The ratio of the mass of the CMC to the mass of the CNTs was changed in the range of from 1/9 to 9 (CNT:CMC=1:9 to 9:1).

Dispersions 1 to 10 were prepared in the same manner as in the above-mentioned "3.1.1. Production of Electromagnetic Wave Shielding Sheet" except for the foregoing.

A dispersion 11 was prepared in the same manner as in the above-mentioned dispersion 1 except that the CMC was not mixed when the mixed liquid was prepared.

A dispersion 12 was prepared in the same manner as in the above-mentioned dispersion 4 except that the aqueous counter collision method was not performed on the mixed liquid. FIG. 11 is a table for showing the preparation conditions of the dispersions 1 to 12.

(2) Evaluation Method

The dispersions 1 to 12 prepared as described above were each put in a petri dish having a diameter of 8.5 cm and dried at 50° C. for 12 hours to evaporate moisture. Then, the dispersibility of the CNTs was evaluated by observing the film-forming property of the dried product. When the dispersibility of the CNTs is more satisfactory, a film having more satisfactory uniformity is formed. The specific evaluation criteria are described below.

A: A crack-free film was formed on an entire surface of the petri dish.
B: A film was formed on the entire surface of the petri dish, but cracks occurred.
C: No film was formed.

(3) Evaluation Results

In FIG. 11, the evaluation results of the dispersibility of the dispersions 1 to 12 are shown. In addition, FIG. 12 is a photograph for showing a state of each of the dispersions 1 to 12 after being put in the petri dish and dried at 50° C. for 12 hours.

Figure 12:
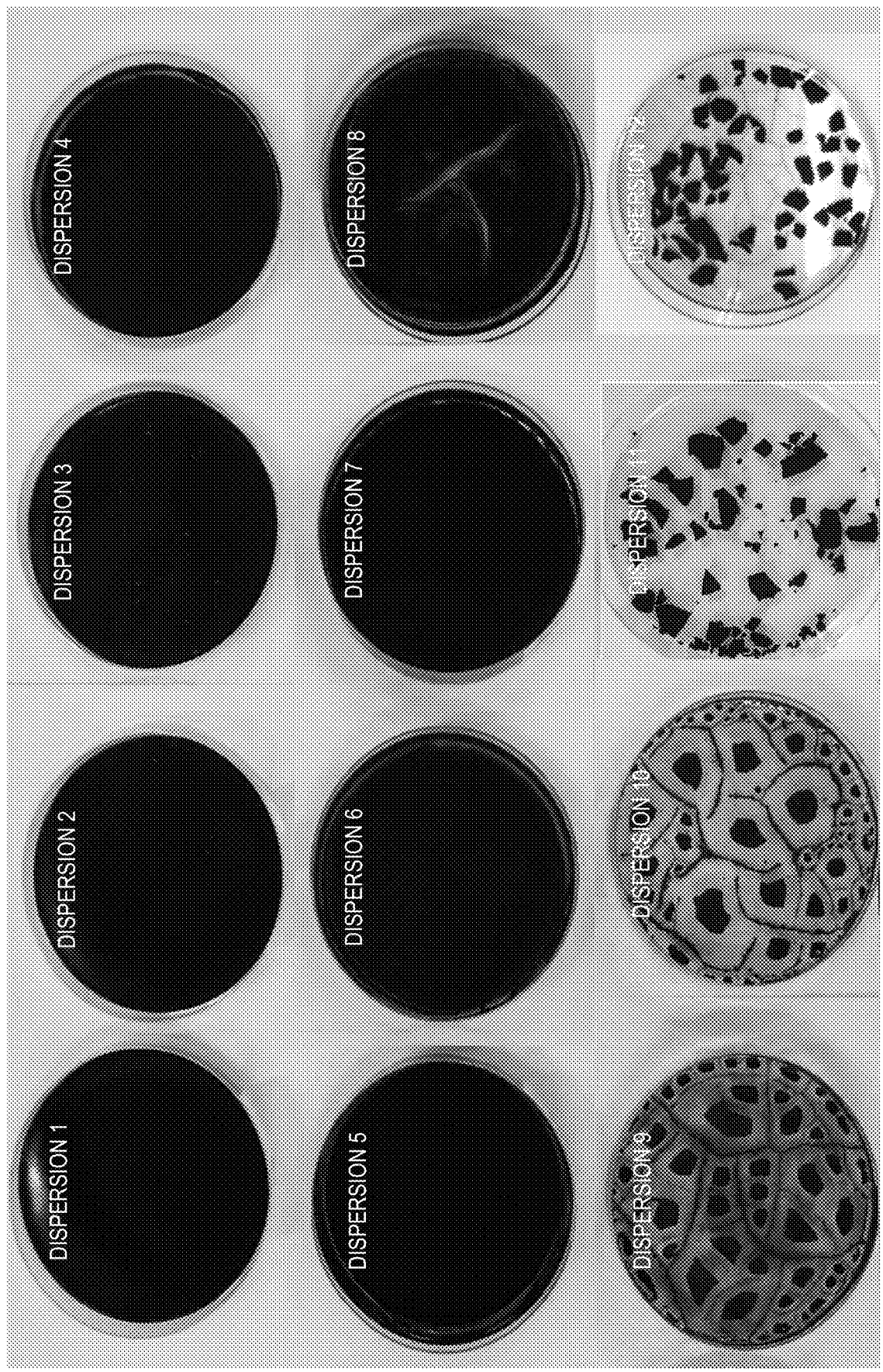
FIG. 12 is a photograph for showing states of the dispersions 1 to 12 after being dried overnight.

As shown in FIG. 11 and FIG. 12, the dispersions 1 to 8 had satisfactory film-forming properties and satisfactory dispersibility of the CNTs as compared to those of the dispersions 9 to 12.

In the dispersions 1 to 7, no significant difference in film-forming property was recognized, and a crack-free film was formed. In the dispersion 8, the content of the CMC with respect to the CNTs was small, and hence cracks occurred in the film. In the dispersions 9 and 10, the content of the CMC with respect to the CNTs was too small, and hence no film was formed. It was found from this evaluation that a dispersion having satisfactory dispersibility was able to be produced by setting the ratio of the mass of the CMC to the mass of the CNTs to 1/7 or more, preferably 1/6 or more.

In the dispersion 11, the CMC was not added to the mixed liquid, and hence the dispersibility of the CNTs was poor, with the result that no film was formed in the same manner as in the dispersions 9 and 10.

In the dispersion 12, the aqueous counter collision method was not performed on the mixed liquid, and hence the dispersibility of the CNTs was poor, with the result that no film was formed. It was found that a dispersion having satisfactory dispersibility was able to be produced by dispersing the CNTs by the aqueous counter collision method.

3.2.2. Evaluation of Electromagnetic Wave Shielding Property
(1) Evaluation Results when Ratio Between CNTs and CMC is Changed Coated paper was produced from the above-mentioned dispersions 1 to 12 in the same manner as in the above-mentioned "3.1.1 Production of Electromagnetic Wave Shielding Sheet". Then, the electromagnetic wave shielding property was evaluated in the same manner as in the evaluation method in the above-mentioned "3.1.2. Evaluation of Electromagnetic Wave Shielding Property".

Figure 14:
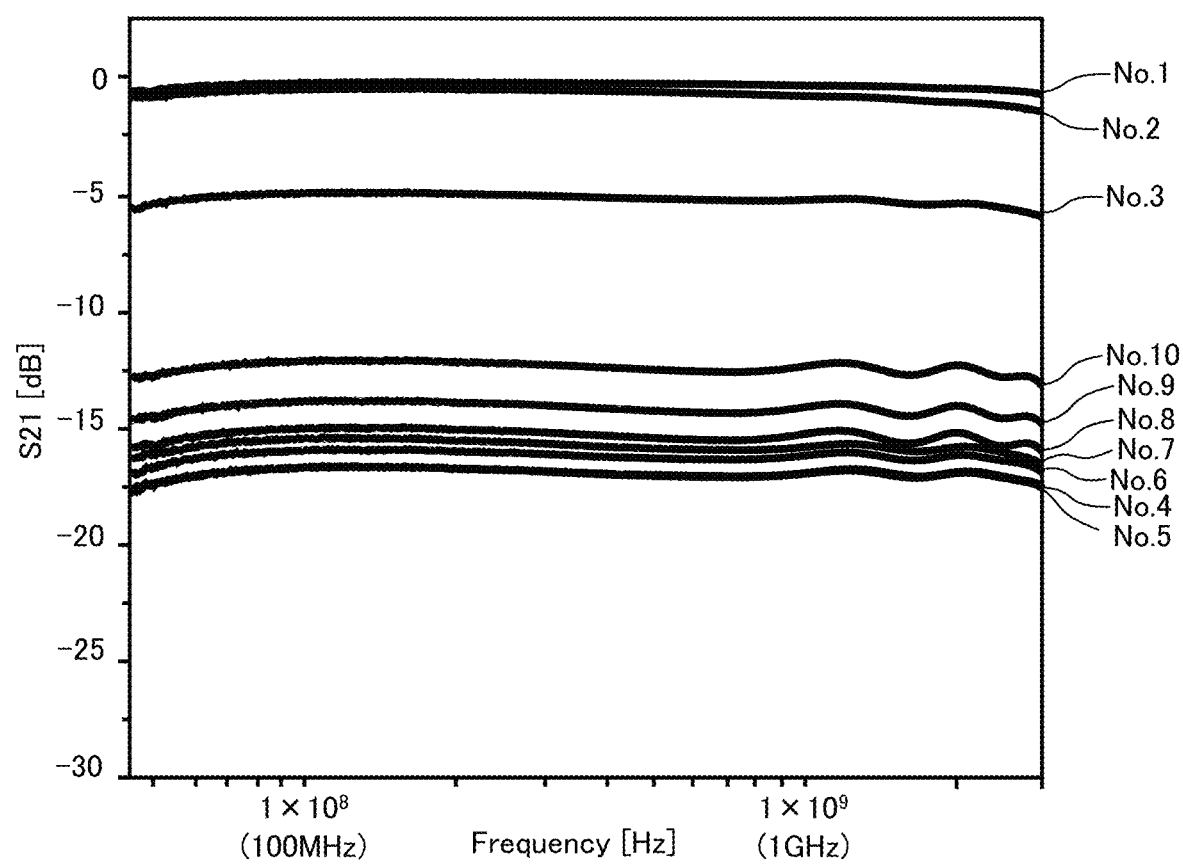
FIG. 14 is a graph for showing "S21" with respect to a frequency.
Figure 15:
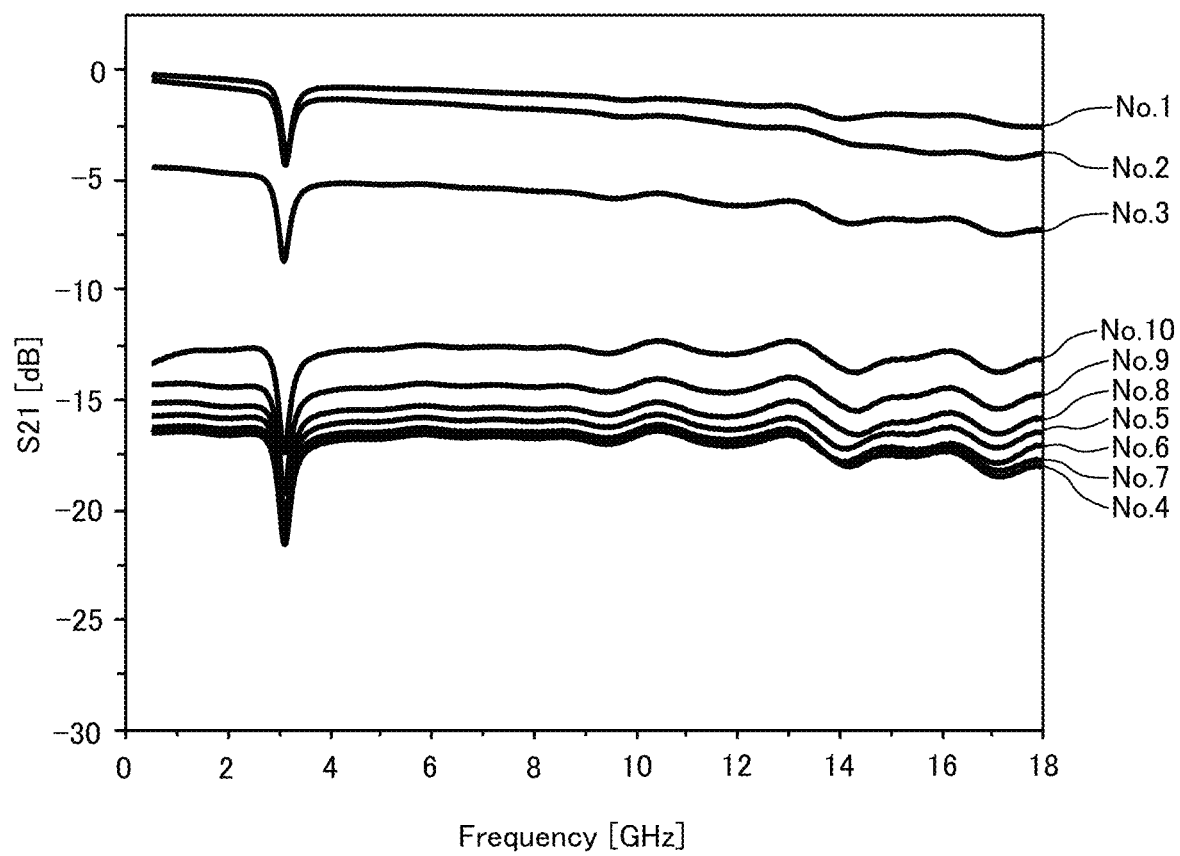
FIG. 15 is a graph for showing "S21" with respect to a frequency.

FIG. 13 is a table for showing the evaluation results of the electromagnetic wave shielding property of the coated paper. FIG. 14 and FIG. 15 are each a graph for showing "S21" with respect to a frequency, and the "S21" shown in FIG. 13 is obtained by reading values at 300 MHz and 7 GHz from FIG. 14 and FIG. 15.

FIG. 14 and FIG. 15 are each a graph for showing "S21" of the coated paper. The measurement frequency of FIG. 14 is from 45 MHz to 3 GHz. and the measurement frequency of FIG. 15 is from 500 MHz to 18 GHz.

As shown in FIG. 13 to FIG. 15, in the coated paper produced from the dispersions 1 to 4, when the CNT content was larger, the absolute value of the "S21" was increased. In the coated paper and the like produced from the dispersions 4 to 7, the "S21" remained substantially at the same level. In the coated paper and the like produced from the dispersions 8 to 10, the absolute value of the "S21" was smaller than those in the coated paper and the like produced from the dispersions 4 to 7. This is presumably because the dispersions 8 to 10 had poor dispersibility as described above, and hence the electromagnetic wave shielding property was decreased.

It was found from the above-mentioned evaluation that the electromagnetic wave shielding property was able to be increased by setting the ratio of the mass of the CMC to the mass of the CNTs to 1/6 or more and 3 or less (CNT:CMC=1:3 to 6:1), preferably 1/6 or more and 1 or less (CNT:CMC=1:1 to 6:1).

(2) Evaluation Results when Number of Passes is Changed

In the above-mentioned dispersion 4 (CNT:CMC=1:1), the number of passes was changed by changing the treatment time of the mixed liquid with the wet pulverization and dispersion device, and thus coated paper was produced in the same manner as in the above-mentioned "(1) Evaluation Results when Ratio between CNTs and CMC is Changed". Then, the electromagnetic wave shielding property of the coated paper was evaluated. The amount of the mixed liquid was adjusted so that the treatment time of 0.5 minute of the mixed liquid with the wet pulverization and dispersion device corresponded to the number of passes of 1. Further, coated paper was produced from the above-mentioned dispersion 12 (dispersion not treated with the wet pulverization and dispersion device) and evaluated in the same manner. The coated paper was able to make the CNT-containing sheet thinner as compared to the dry film, and hence evaluation was able to be performed even with the dispersion 12 having poor dispersibility.

Figure 17:
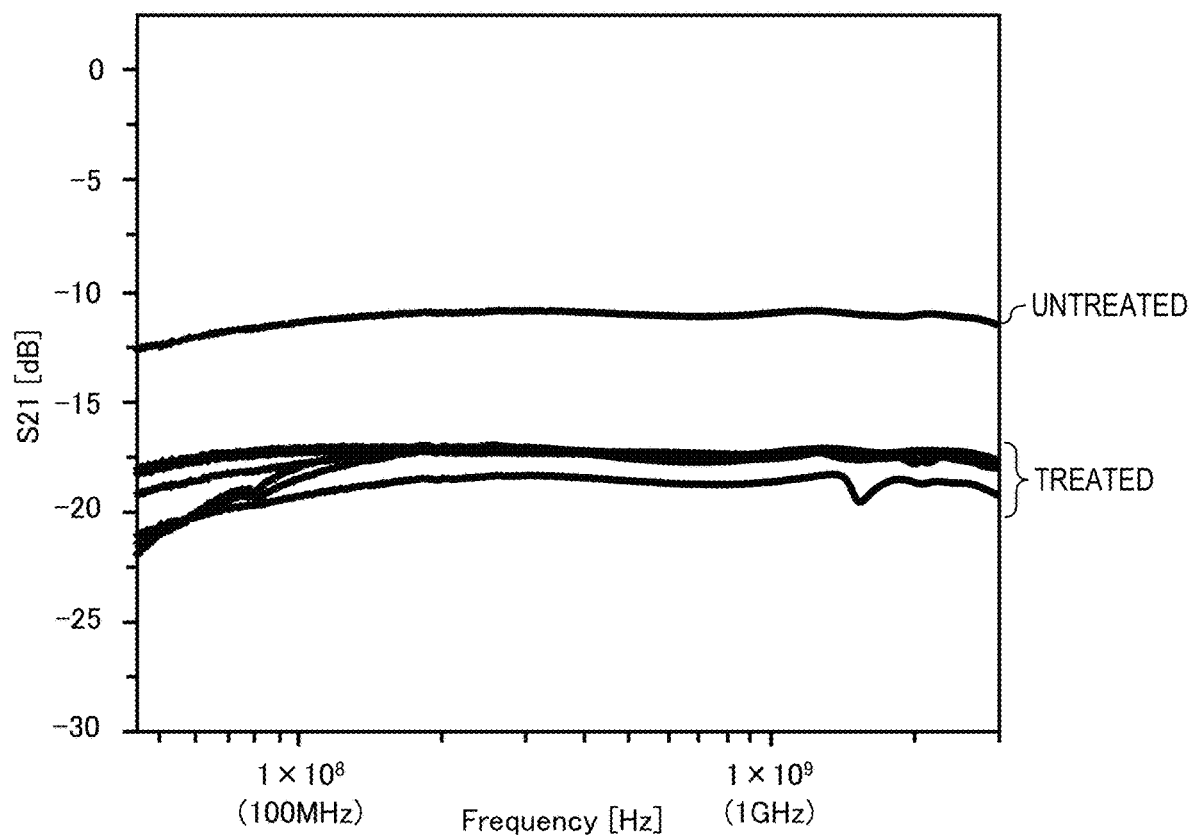
FIG. 17 is a graph for showing "S21" with respect to a frequency.
Figure 18:
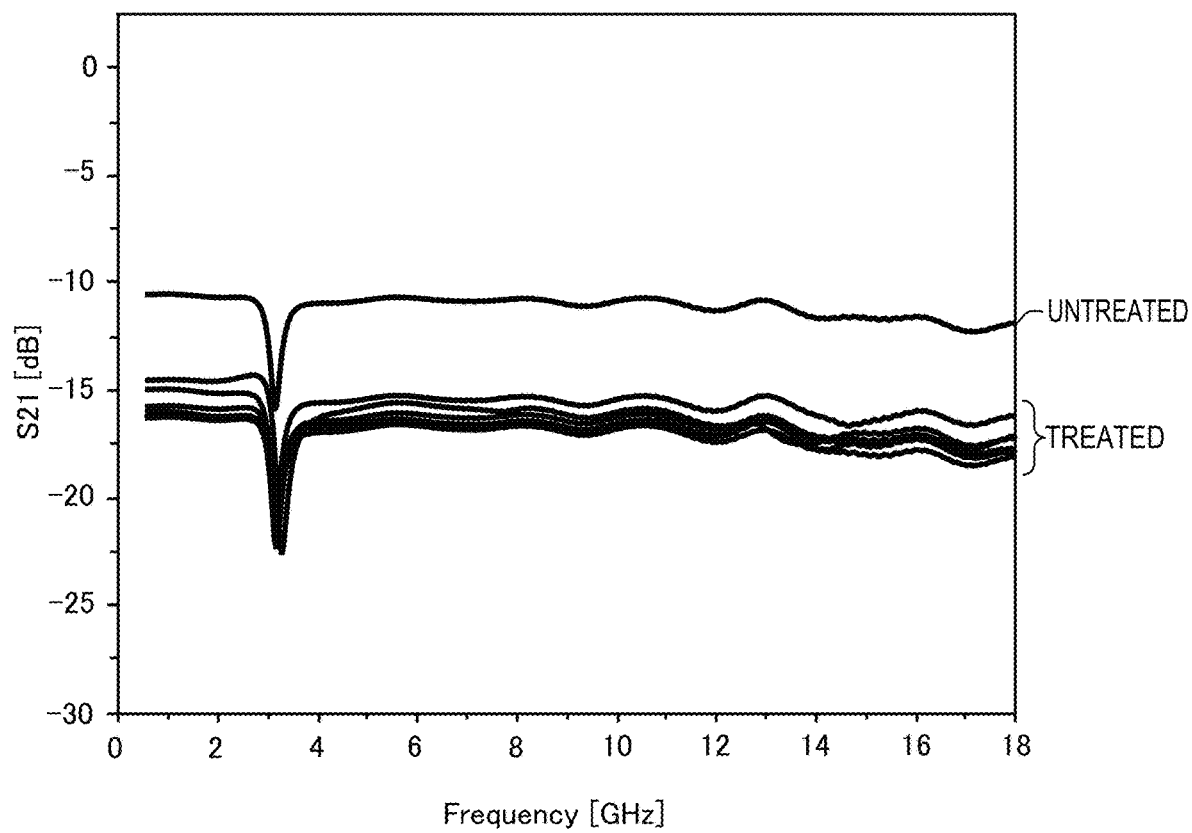
FIG. 18 is a graph for showing "S21" with respect to a frequency.

FIG. 16 is a table for showing the evaluation results of the electromagnetic wave shielding property when the number of passes is changed. FIG. 17 and FIG. 18 are each a graph for showing "S21" with respect to a frequency, and the "S21" shown in FIG. 16 is obtained by reading values at 300 MHz and 7 GHz from FIG. 17 and FIG. 18, respectively. The measurement frequency of FIG. 17 is from 45 MHz to 3 GHz. and the measurement frequency of FIG. 18 is from 500 MHz to 18 GHz.

As shown in FIG. 16 to FIG. 18, the coated paper treated with the wet pulverization and dispersion device had a high electromagnetic wave shielding property as compared to the untreated coated paper. As shown in FIG. 16, the untreated coated paper had a low electromagnetic wave shielding property despite the large thickness.

It was found from the above-mentioned evaluation that the shielding property was able to be increased by performing the treatment with the wet pulverization and dispersion device, that is, the aqueous counter collision method. In FIG. 16 to FIG. 18, regarding the coated paper treated with the wet pulverization and dispersion device, no significant difference was recognized in the electromagnetic wave shielding property.

3.3. Third Experimental Example

In the first experimental example, the electromagnetic wave shielding property was evaluated by the coaxial tube method. However, in the third experimental example, the electromagnetic wave noise suppression performance was evaluated by a microstrip line method. The coated paper containing the inorganic pigment produced in the first experimental example was evaluated. As a testing machine, a network analyzer "ZVA67" manufactured by Rohde & Schwarz and a test fixture "TF-18C" manufactured by Keycom Corporation were used. The measurement frequency was set to from 500 MHz to 18 GHz.

FIG. 19 is a table for showing the evaluation results of the electromagnetic wave noise suppression performance of the coated paper, in which "Rtp" at 6 GHz and 15 GHz is shown. The "Rtp" indicates a transmission attenuation rate. When the absolute value of the transmission attenuation rate is larger, the electromagnetic wave noise suppression performance is higher.

Figure 20:
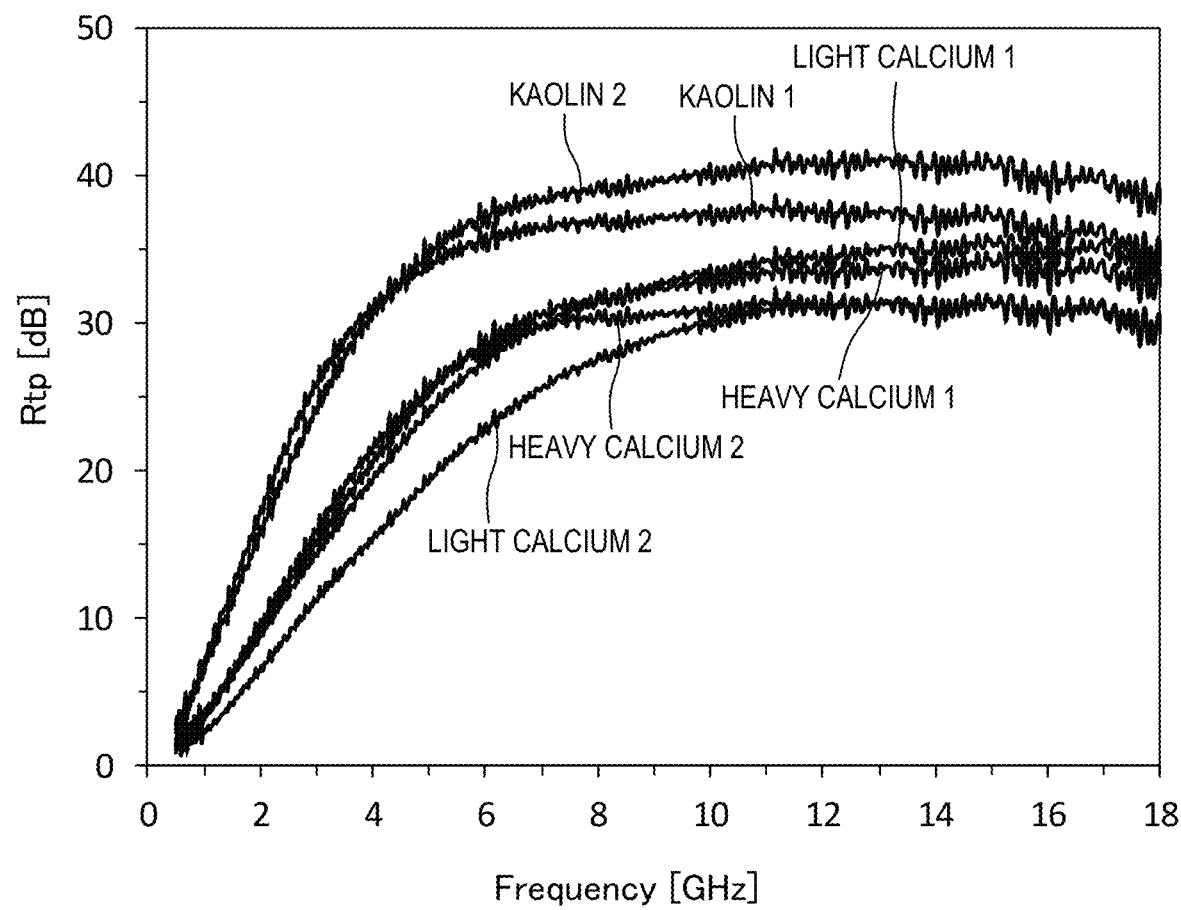
FIG. 20 is a graph for showing "Rtp" with respect to a frequency when the ratio of an inorganic pigment to carbon nanotubes is 0.25.
Figure 21:
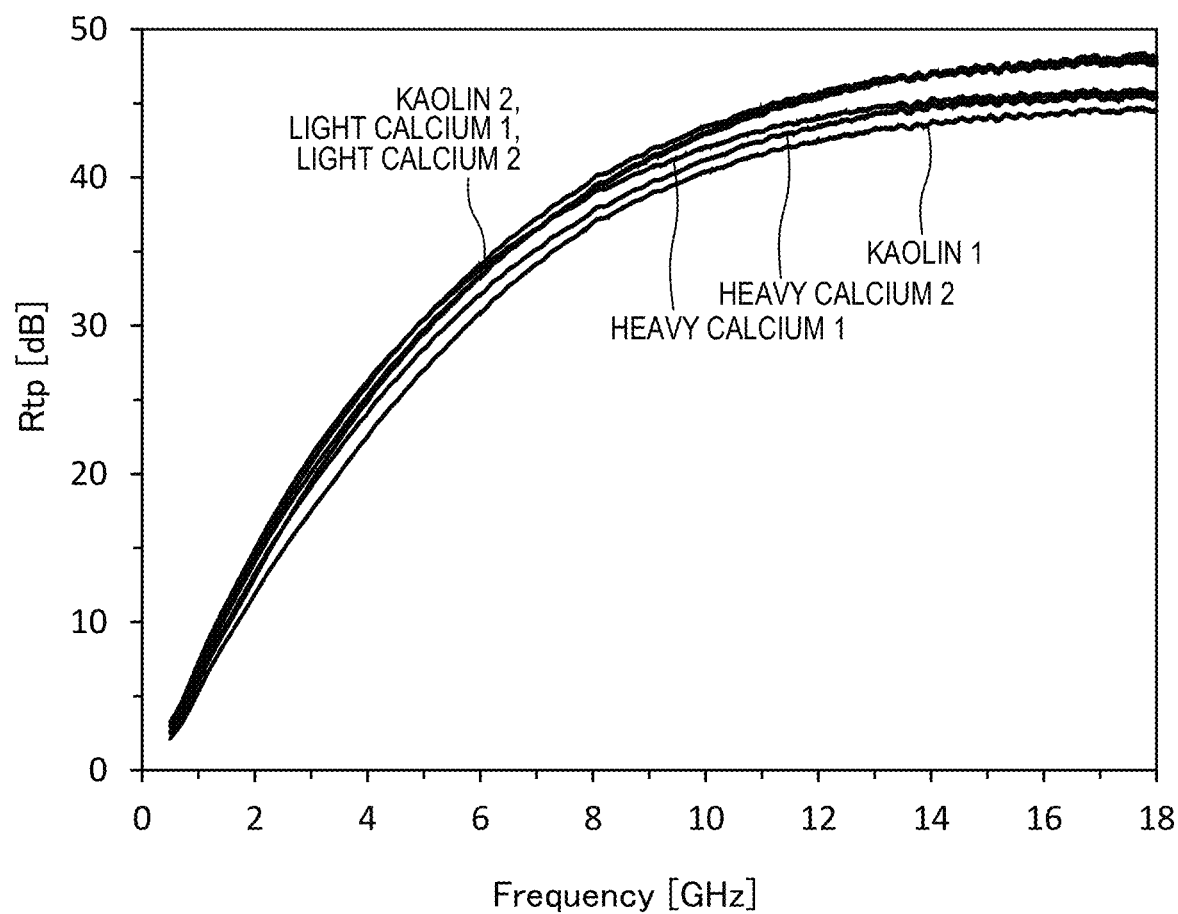
FIG. 21 is a graph for showing "Rtp" with respect to a frequency when the ratio of an inorganic pigment to carbon nanotubes is 0.5.
Figure 22:
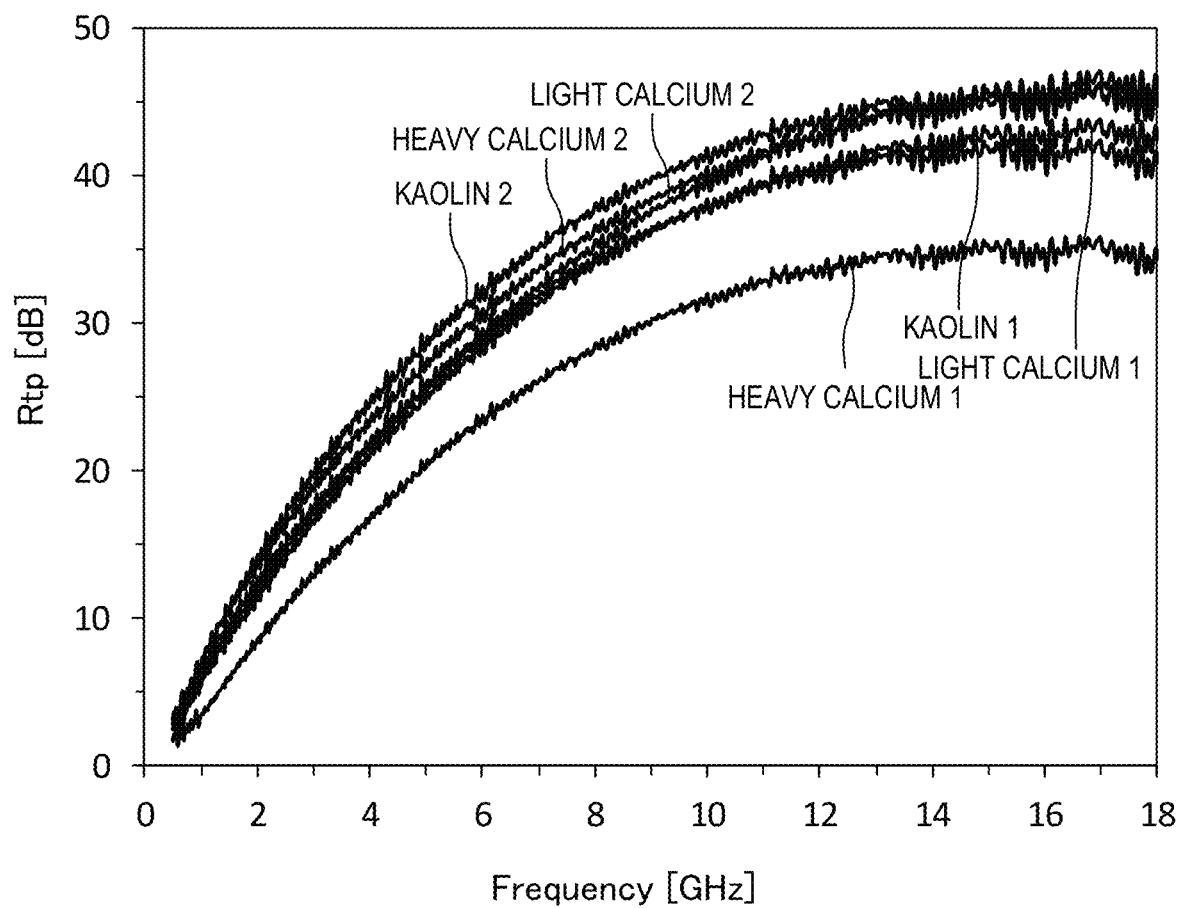
FIG. 22 is a graph for showing "Rtp" with respect to a frequency when the ratio of an inorganic pigment to carbon nanotubes is 1.0.
Figure 23:
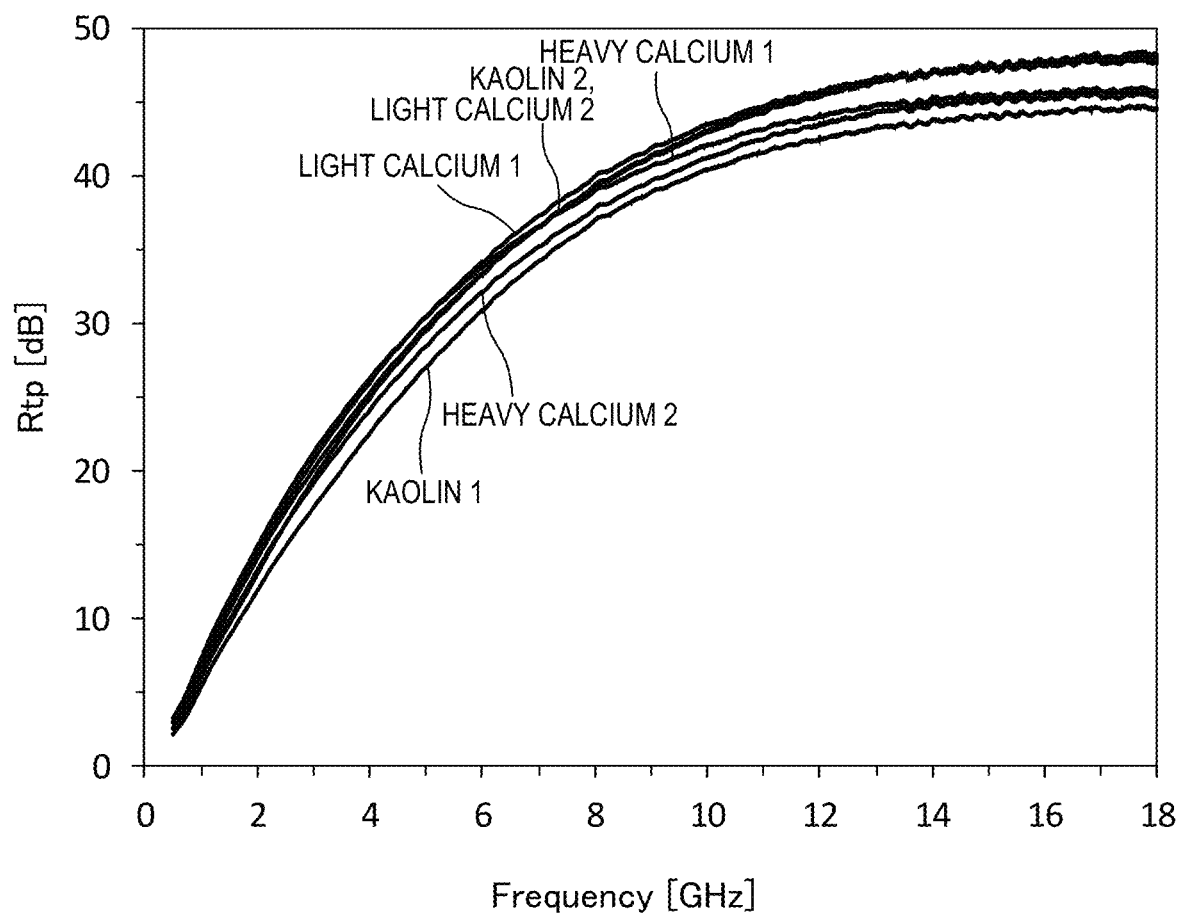
FIG. 23 is a graph for showing "Rtp" with respect to a frequency when the ratio of an inorganic pigment to carbon nanotubes is 2.0.
Figure 24:
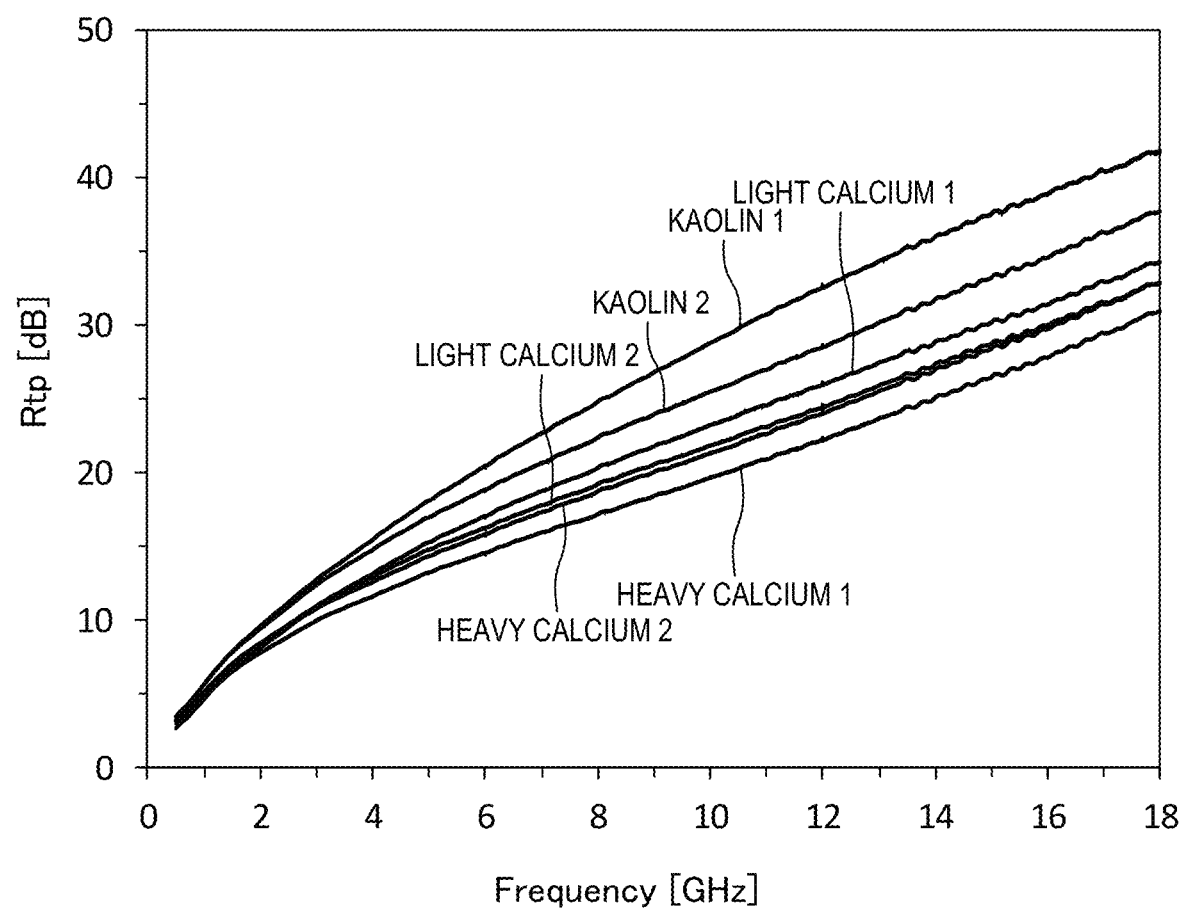
FIG. 24 is a graph for showing "Rtp" with respect to a frequency when the ratio of an inorganic pigment to carbon nanotubes is 3.0.
Figure 25:
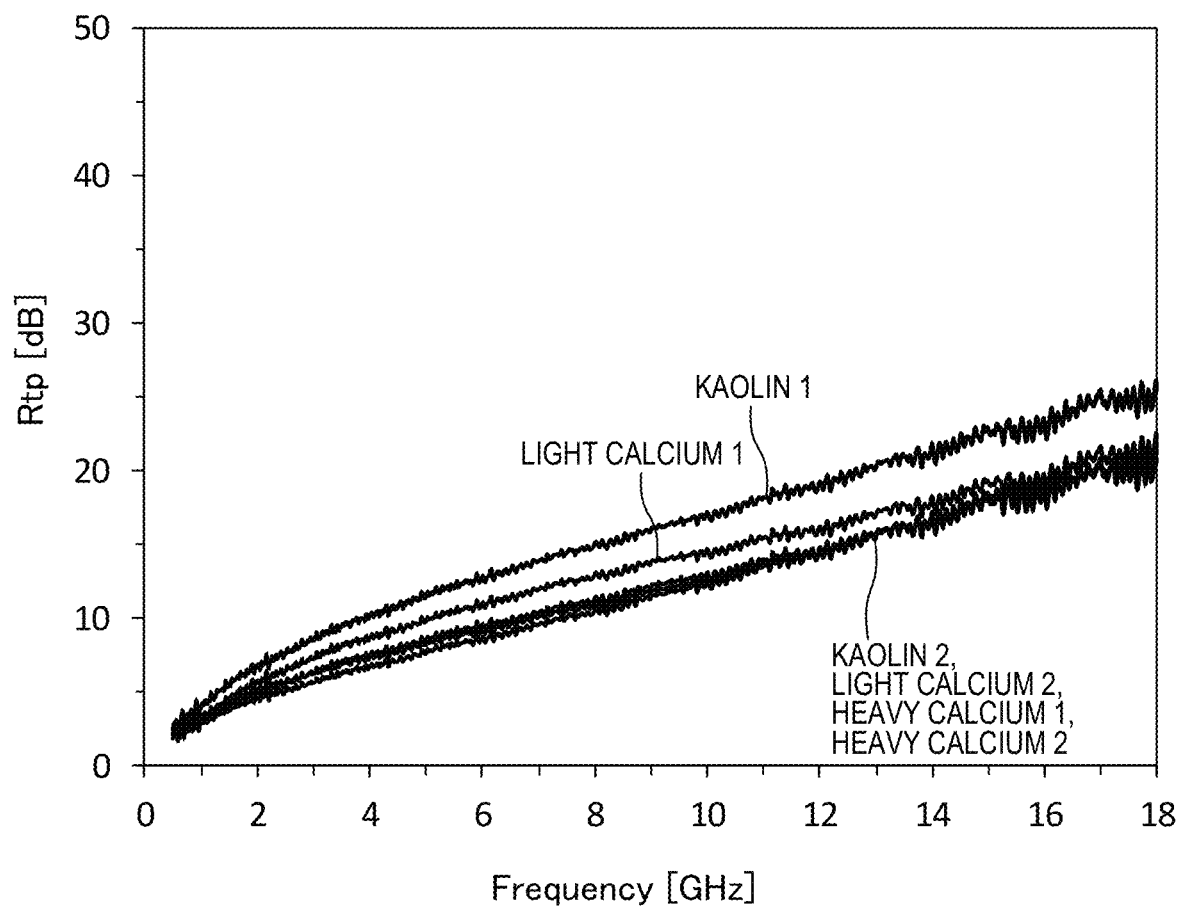
FIG. 25 is a graph for showing "Rtp" with respect to a frequency when the ratio of an inorganic pigment to carbon nanotubes is 4.0.

FIG. 20 to FIG. 25 are each a graph for showing "Rtp" with respect to a frequency, and the "Rtp" shown in FIG. 19 is obtained by reading values at 6 GHz and 15 GHz from FIG. 20 to FIG. 25. In FIG. 20, a case in which the ratio of the inorganic pigment to the CNTs (hereinafter sometimes referred to as "inorganic pigment ratio") is 0.25 is shown. In FIG. 21, a case in which the inorganic pigment ratio is 0.5 is shown. In FIG. 22, a case in which the inorganic pigment ratio is 1.0 is shown. In FIG. 23, a case in which the inorganic pigment ratio is 2.0 is shown. In FIG. 24, a case in which the inorganic pigment ratio is 3.0 is shown. In FIG. 25, a case in which the inorganic pigment ratio is 4.0 is shown.

As shown in FIG. 20, at the inorganic pigment ratio of "0.25", the kaolins 1 and 2 had large "Rtp" as compared to those of the light calciums 1 and 2 and the heavy calciums 1 and 2. As shown in FIG. 19, the "Rtp" at 6 GHz was larger in the kaolins 1 and 2 at the inorganic pigment ratio of "0.25" than those in the kaolins 1 and 2 at the inorganic pigment ratio of from "0.5" to "4.0".

In all the inorganic pigments, the "Rtp" at 15 GHz was larger at the inorganic pigment ratios of "0.5", "1.0", and "2.0" than those at the inorganic pigment ratios of "0.25" "3.0", and "4.0".

The above-mentioned embodiments and modification examples are merely examples, and the present invention is not limited thereto. For example, each of the embodiments and each of the modification examples may also be appropriately combined.

The present invention is not limited to the embodiments described above, and various modifications may be made thereto. For example, the present invention encompasses configurations that are substantially the same as the configurations described above in connection with the embodiments. The configurations that are substantially the same are, for example, a configuration having the same function, method, and results, and a configuration having the same objective and effects. The present invention also encompasses a configuration in which an unsubstantial part of the configurations described above in connection with the embodiments is replaced by another configuration. The present invention also encompasses a configuration having the same effects as those of the configurations described above in connection with the embodiments, or a configuration capable of achieving the same objective as that of the configurations described above in connection with the embodiments. The present invention also encompasses a configuration in which a known technique is added to the configurations described above in connection with the embodiments.

The invention claimed is:

1. A method of producing an electromagnetic wave shielding sheet, comprising:
    preparing a dispersion containing carbon nanotubes, one or more inorganic pigments, sodium carboxymethyl cellulose, and water; and
    drying the dispersion,
    wherein the ratio of the total mass of all the inorganic pigments to the total mass of the carbon nanotubes in the dispersion is from 1/4 or more to 1 or less.

2. The method of producing an electromagnetic wave shielding sheet according to claim 1, wherein the one or more inorganic pigments comprise kaolin.

3. The method of producing an electromagnetic wave shielding sheet according to claim 1, wherein the ratio of the mass of the sodium carboxymethyl cellulose to the sum of the mass of the carbon nanotubes and the total mass of all the inorganic pigments in the dispersion is from 1/6 or more to 3 or less.

4. The method of producing an electromagnetic wave|shielding sheet according to claim 1, wherein only the sodium carboxymethyl cellulose is used as a dispersant in the step of preparing the dispersion.

5. The method of producing an electromagnetic wave shielding sheet according to claim 1, wherein the preparing the dispersion includes:
   preparing mixed liquids by mixing the carbon nanotubes, the one or more inorganic pigments, the sodium carboxymethyl cellulose, and the water; and
   dispersing the carbon nanotubes contained in the mixed liquids by an aqueous counter collision method.

* * * * *